(12) United States Patent
Tsuchi

(10) Patent No.: US 11,356,113 B2
(45) Date of Patent: Jun. 7, 2022

(54) DIGITAL-TO-ANALOG CONVERSION CIRCUIT AND DATA DRIVER

(71) Applicant: LAPIS Semiconductor Co., Ltd., Yokohama (JP)

(72) Inventor: Hiroshi Tsuchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/800,835

(22) Filed: Feb. 25, 2020

(65) Prior Publication Data

US 2020/0295775 A1   Sep. 17, 2020

(30) Foreign Application Priority Data

Mar. 12, 2019   (JP) ................ JP2019-45089

(51) Int. Cl.
  G09G 5/10      (2006.01)
  H03M 1/78      (2006.01)
  H03M 1/68      (2006.01)
  H03F 3/45      (2006.01)
  G09G 3/20      (2006.01)

(52) U.S. Cl.
  CPC .............. *H03M 1/785* (2013.01); *G09G 3/20* (2013.01); *G09G 5/10* (2013.01); *H03F 3/45273* (2013.01); *H03M 1/68* (2013.01); *G09G 2310/027* (2013.01); *G09G 2310/0291* (2013.01); *G09G 2320/0646* (2013.01)

(58) Field of Classification Search
  CPC ........ H03M 1/785; H03M 1/68; H03M 1/742; H03F 3/45273; H03F 3/183; G09G 5/10; G09G 3/20; G09G 2320/0646; G09G 2310/027; G09G 2310/0291; G09G 2320/0276; G09G 3/3692; G09G 2330/028; G09G 2310/0286
  See application file for complete search history.

(56) References Cited

U.S. PATENT DOCUMENTS 6,535,189 B1 *   3/2003   Akiyama ............. G09G 3/3688
                                                   345/87
2011/0090198 A1 *  4/2011   Hsueh ................. G09G 3/3688
                                                   345/211

(Continued)

FOREIGN PATENT DOCUMENTS

JP   2000183747 A   6/2000
JP   2002043944 A   2/2002
JP   2006197532 A   7/2006

(Continued)

*Primary Examiner* — Jeff Piziali
(74) *Attorney, Agent, or Firm* — Rabin & Berdo, P.C.

(57) ABSTRACT

A digital-to-analog conversion circuit includes: a decoder that, if set to a first selection state, selects two different reference voltages from a reference voltage group on the basis of a digital data signal and outputs the two reference voltages as first and second selection voltages, and if set to a second selection state, selects two reference voltages from the reference voltage group in a manner allowing redundancy and outputs the two reference voltages as the first and second selection voltages; and an amplifier circuit that amplifies and outputs a voltage obtained by averaging a combination of the first and second selection voltages with weighting factors set in advance.

14 Claims, 17 Drawing Sheets

(56) References Cited

U.S. PATENT DOCUMENTS

2011/0310080 A1* 12/2011 Tonomura ............ G09G 3/3688
345/211
2018/0061359 A1* 3/2018 Shiibayashi ......... G09G 3/3648

FOREIGN PATENT DOCUMENTS

| JP | 2008067145 A | 3/2008 |
| JP | 2008122455 A | 5/2008 |
| JP | 2009284310 A | 12/2009 |
| JP | 2018036534 A | 3/2018 |

* cited by examiner

| FIRST SELECTION STATE (CTL=0) | | SECOND SELECTION STATE (CTL=1) | |
|---|---|---|---|
| FIRST SELECTION VOLTAGE | SECOND SELECTION VOLTAGE | FIRST SELECTION VOLTAGE | SECOND SELECTION VOLTAGE |
| VA | VB | VA OR VB | VA OR VB |
| OUTPUT VA TO m OF T1 TO TN, AND OUTPUT VB TO REMAINING (N − m) | | OUTPUT VA OR VB TO T1 TO TN | |

FIG. 6

| level | Vref | V(T1) | V(T2) | D3 | D2 | D1 | D0 |
|---|---|---|---|---|---|---|---|
| 0 | Vr0 | Vr0 | Vr0 | 0 | 0 | 0 | 0 |
| 1 |  | Vr0 | Vr1 | 0 | 0 | 0 | 1 |
| 2 | Vr1 | Vr1 | Vr1 | 0 | 0 | 1 | 0 |
| 3 |  | Vr1 | Vr2 | 0 | 0 | 1 | 1 |
| 4 | Vr2 | Vr2 | Vr2 | 0 | 1 | 0 | 0 |
| 5 |  | Vr2 | Vr3 | 0 | 1 | 0 | 1 |
| 6 | Vr3 | Vr3 | Vr3 | 0 | 1 | 1 | 0 |
| 7 |  | Vr3 | Vr4 | 0 | 1 | 1 | 1 |
| 8 | Vr4 | Vr4 | Vr4 | 1 | 0 | 0 | 0 |
| 9 |  | Vr4 | Vr5 | 1 | 0 | 0 | 1 |
| 10 | Vr5 | Vr5 | Vr5 | 1 | 0 | 1 | 0 |
| 11 |  | Vr5 | Vr6 | 1 | 0 | 1 | 1 |
| 12 | Vr6 | Vr6 | Vr6 | 1 | 1 | 0 | 0 |
| 13 |  | Vr6 | Vr7 | 1 | 1 | 0 | 1 |
| 14 | Vr7 | Vr7 | Vr7 | 1 | 1 | 1 | 0 |
| 15 |  | Vr7 | Vr8 | 1 | 1 | 1 | 1 |

| level | Vref | V(T1) | V(T2) | V(T3) | D4 | D3 | D2 | D1 | D0 |
|---|---|---|---|---|---|---|---|---|---|
| 0 | Vr0 | Vr0 | Vr0 | Vr0 | 0 | 0 | 0 | 0 | 0 |
| 1 | | Vr0 | Vr1 | Vr0 | 0 | 0 | 0 | 0 | 1 |
| 2 | | Vr0 | Vr0 | Vr1 | 0 | 0 | 0 | 1 | 0 |
| 3 | | Vr0 | Vr1 | Vr1 | 0 | 0 | 0 | 1 | 1 |
| 4 | Vr1 | Vr1 | Vr1 | Vr1 | 0 | 0 | 1 | 0 | 0 |
| 5 | | Vr1 | Vr2 | Vr1 | 0 | 0 | 1 | 0 | 1 |
| 6 | | Vr1 | Vr1 | Vr2 | 0 | 0 | 1 | 1 | 0 |
| 7 | | Vr1 | Vr2 | Vr2 | 0 | 0 | 1 | 1 | 1 |
| 8 | Vr2 | Vr2 | Vr2 | Vr2 | 0 | 1 | 0 | 0 | 0 |
| 9 | | Vr2 | Vr3 | Vr2 | 0 | 1 | 0 | 0 | 1 |
| 10 | | Vr2 | Vr2 | Vr3 | 0 | 1 | 0 | 1 | 0 |
| 11 | | Vr2 | Vr3 | Vr3 | 0 | 1 | 0 | 1 | 1 |
| 12 | Vr3 | Vr3 | Vr3 | Vr3 | 0 | 1 | 1 | 0 | 0 |
| 13 | | Vr3 | Vr4 | Vr3 | 0 | 1 | 1 | 0 | 1 |
| 14 | | Vr3 | Vr3 | Vr4 | 0 | 1 | 1 | 1 | 0 |
| 15 | | Vr3 | Vr4 | Vr4 | 0 | 1 | 1 | 1 | 1 |
| 16 | Vr4 | Vr4 | Vr4 | Vr4 | 1 | 0 | 0 | 0 | 0 |
| 17 | | Vr4 | Vr5 | Vr4 | 1 | 0 | 0 | 0 | 1 |
| 18 | | Vr4 | Vr4 | Vr5 | 1 | 0 | 0 | 1 | 0 |
| 19 | | Vr4 | Vr5 | Vr5 | 1 | 0 | 0 | 1 | 1 |
| 20 | Vr5 | Vr5 | Vr5 | Vr5 | 1 | 0 | 1 | 0 | 0 |
| 21 | | Vr5 | Vr6 | Vr5 | 1 | 0 | 1 | 0 | 1 |
| 22 | | Vr5 | Vr5 | Vr6 | 1 | 0 | 1 | 1 | 0 |
| 23 | | Vr5 | Vr6 | Vr6 | 1 | 0 | 1 | 1 | 1 |
| 24 | Vr6 | Vr6 | Vr6 | Vr6 | 1 | 1 | 0 | 0 | 0 |

| CTL=0 | FIRST SELECTION STATE | |
|---|---|---|
| | 0 | 1 |
| DO | | |
| V(T1) | VA | VA |
| V(T2) | VB | VB |

FIG. 10A

| CTL=1 | SECOND SELECTION STATE | |
|---|---|---|
| | 0 | 1 |
| DO | | |
| V(T1) | VA | VA |
| V(T2) | VA | VB |

FIG. 10B

| CTL=0 | 0 | 1 | 1 | 0 | 1 |
|---|---|---|---|---|---|
| D0 | 0 | 1 | 0 | 1 | 1 |
| D1 | 0 | 0 | 1 | 1 | 1 |
| V(T1) | VA | VA | VA | VA | VA |
| V(T2) | VA | VA | VA | VA | VA |
| V(T3) | VB | VB | VB | VB | VB |

FIRST SELECTION STATE

FIG. 13A

| CTL=1 | 0 | 1 | 1 | 0 | 1 |
|---|---|---|---|---|---|
| D0 | 0 | 1 | 0 | 1 | 1 |
| D1 | 0 | 0 | 1 | 1 | 1 |
| V(T1) | VA | VA | VB | VA | VA |
| V(T2) | VA | VB | VA | VA | VB |
| V(T3) | VA | VA | VA | VB | VB |

SECOND SELECTION STATE

FIG. 13B

| level | Vref | V(T1) | V(T2) | D3 | D2 | D1 | D0 |
|---|---|---|---|---|---|---|---|
| 0 | Vr0 | | Vr1 | 0 | 0 | 0 | 0 |
| 1 | | Vr1 | Vr1 | 0 | 0 | 0 | 1 |
| 2 | | Vr1 | Vr2 | 0 | 0 | 1 | 0 |
| 3 | | Vr2 | Vr2 | 0 | 0 | 1 | 1 |
| 4 | | Vr2 | Vr3 | 0 | 1 | 0 | 0 |
| 5 | | Vr3 | Vr3 | 0 | 1 | 0 | 1 |
| 6 | | Vr3 | Vr4 | 0 | 1 | 1 | 0 |
| 7 | | Vr4 | Vr4 | 0 | 1 | 1 | 1 |
| 8 | | Vr4 | Vr5 | 1 | 0 | 0 | 0 |
| 9 | | Vr5 | Vr5 | 1 | 0 | 0 | 1 |
| 10 | | Vr5 | Vr6 | 1 | 0 | 1 | 0 |
| 11 | | Vr6 | Vr6 | 1 | 0 | 1 | 1 |
| 12 | | Vr6 | Vr7 | 1 | 1 | 0 | 0 |
| 13 | | Vr7 | Vr7 | 1 | 1 | 0 | 1 |
| 14 | | Vr7 | Vr8 | 1 | 1 | 1 | 0 |
| 15 | | Vr8 | Vr8 | 1 | 1 | 1 | 1 |

FIG. 16A

| CTL=0 | FIRST SELECTION STATE | |
|---|---|---|
| D0 | 0 | 1 |
| V(T1) | VA | VA |
| V(T2) | VB | VB |

FIG. 16B

| CTL=1 | SECOND SELECTION STATE | |
|---|---|---|
| D0 | 0 | 1 |
| V(T1) | VA | VB |
| V(T2) | VB | VB |

FIG. 16C

DIGITAL-TO-ANALOG CONVERSION CIRCUIT AND DATA DRIVER

BACKGROUND

1. Technical Field

The present invention relates to a digital-to-analog conversion circuit and a data driver of a display apparatus.

2. Related Art

Current mainstream display apparatuses of active matrix type include liquid crystal display apparatuses and organic EL display apparatuses. Such a display apparatus includes a display panel, a data driver, and a scan driver. The display panel has a plurality of data lines and a plurality of scan lines intersecting each other. Display cells connected to the plurality of data lines via pixel switches are arranged in a matrix. The data driver supplies analog voltage signals corresponding to gradation levels to the plurality of data lines of the display panel. The scan driver supplies scan signals for controlling the pixel switches on and off to the plurality of scan lines of the display panel. The data driver includes a digital-to-analog conversion circuit that converts a video digital signal into analog voltages corresponding to brightness levels, and supplies voltage signals obtained by amplifying the analog voltages to the data lines of the display panel.

A schematic configuration of the data driver will be described below.

The data driver includes, for example, a shift register, a data register latch, a level shifter, and a digital-to-analog (DA) conversion unit.

The shift register generates a plurality of latch timing signals for selecting a latch in synchronization with a clock signal on the basis of a start pulse supplied from a display controller, and supplies the plurality of latch timing signals to the data register latch. The data register latch latches a predetermined number of (for example, n) pieces of video digital data supplied from the display controller on the basis of the respective latch timing signals supplied from the shift register. The data register latch supplies n video digital data signals representing the respective pieces of video digital data to the level shifter. The level shifter applies level shift processing for increasing signal amplitude to each of the n video digital data signals supplied from the data register latch, and supplies the resulting n level-shifted video digital data signals to the DA conversion unit.

The DA conversion unit includes a reference voltage generation circuit, a decoder unit, and an amplification unit.

The reference voltage generation circuit generates a plurality of reference voltages having respective different voltage values, and supplies the reference voltages to the decoder unit. For example, the reference voltage generation circuit supplies a plurality of divided voltages, generated by dividing a voltage between a power supply voltage and a reference voltage with a ladder resistor, to the decoder unit as a reference voltage group. Digital-to-analog conversion using a plurality of reference voltages generated by using a ladder resistor is referred to as resistive digital-to-analog conversion (RDAC).

The decoder unit includes n decoder circuits corresponding to respective outputs of the data driver. Each decoder circuit receives a video digital data signal supplied from the level shifter, selects a reference voltage corresponding to the video digital data signal from the plurality of reference voltages, and supplies the selected reference voltage to the amplification unit.

The amplification unit includes n amplifier circuits that individually amplify and output the reference voltages selected by the respective decoder circuits of the decoder unit.

The greater the number of reference voltages generated by the reference voltage generation circuit, the greater the number of gradations (number of colors) of brightness levels the DA conversion unit can express. However, as the number of reference voltages for the reference voltage generation circuit to generate increases, the chip size (manufacturing cost) of the data driver increases accordingly.

In view of this, digital-to-analog conversion circuits that use operational amplifiers for performing so-called interpolation operation as the foregoing amplifier circuits have been proposed (for example, see Japanese Patent Application Laid-Open Nos. 2000-183747, 2002-43944, and 2009-284310). The interpolation operation refers to generation of voltages between mutually adjoining ones of a plurality of input voltages by averaging the plurality of input voltages with weights (also referred to as weighted averaging).

An amplifier circuit that performs such interpolation operation (also referred to as an interpolation amplifier) can provide, by interpolation operation based on a plurality of input voltages, a greater number of gradations of voltage values than the number of voltage values that can be expressed by the plurality of input voltages. Voltages as many as the desired number of gradations can thus be generated even if the total number of reference voltages for the reference voltage generation circuit to generate is reduced.

The amplifier circuit included in the foregoing digital-to-analog conversion circuit will be described below with reference to FIGS. 1A and 1B.

FIG. 1A is a circuit diagram showing an example of a configuration of the amplifier circuit. The amplifier circuit shown in FIG. 1A receives x (x is an integer of 2 or more) input voltages V1 to Vx, performs interpolation operation on the input voltages V1 to Vx to generate a weighted average voltage of the input voltages V1 to Vx, and outputs the weighted average voltage.

The amplifier circuit includes x non-inverting input terminals P1 to Px for receiving the input voltages V1 to Vx, an inverting input terminal, an output terminal Sk, x differential stage circuits $29\_1$ to $29\_x$ of the same conduction type, a current mirror circuit 28, and an amplifier stage circuit 26.

The differential stage circuit $29\_x$ includes a differential pair including N-channel transistors $21\_x$ and $22\_x$, and a current source $23\_x$ for driving the differential pair. The current source $23\_x$ is located between the differential pair and a power supply terminal VSS. Each of the other differential stage circuits $29\_1$ to $29\_(x-1)$ has the same configuration as that of the differential stage circuit $29\_x$. The gate of either one of the transistors in each differential pair, or equivalently, the gates of the transistors $21\_1$ to $21\_x$ constitute the non-inverting input terminals P1 to Px of the amplifier circuit. The gates of the other transistors $22\_1$ to $22\_x$ in the respective differential pairs are connected in common to constitute the inverting input terminal of the amplifier circuit.

The inverting input terminal of the amplifier circuit is connected to the output terminal Sk, whereby a feedback amplifier circuit of voltage follower type is constituted. Either one of the output ends of the differential pair in each of the differential stage circuit 29_1 to 29_$x$ is connected to a node n21 in common. The other output ends of the differential pairs in the respective differential stage circuits 29_1 to 29_$x$ are connected to a node n22 in common.

The current mirror circuit 28 includes P-channel transistors 24 and 25. The current mirror circuit 28 is located between a power supply terminal VDD and the nodes n21 and n22. The amplifier stage circuit 26 causes an amplification operation by receiving at least the voltage appearing on the node n21, and outputs an amplified output voltage Vout from the output terminal Sk. The voltage value of the output voltage Vout here will be referred to as a voltage Vexp.

A relationship between the input voltages (signal voltages) V1 to Vx input to the non-inverting input terminals P1 to Px of the amplifier circuit and the voltage Vexp will be described below.

The signal voltages V1 to Vx have voltages corresponding to levels selected by the decoder circuits in each predetermined data period. The signal voltages V1 to Vx each are a step signal voltage whose voltage value varies stepwise from that of the voltage in the immediately previous data period. The signal voltages V1 to Vx constitute a group of x voltages possibly including the same voltages within a voltage range sufficiently smaller than the output dynamic range of the amplifier circuit.

If the amplifier circuit has an amplification factor of 1, the voltage Vexp corresponds to a weighted average of the input signal voltages V1 to Vx.

Now, an operation of the amplifier circuit will be described by using a case where the transistors constituting the differential pair in the jth (j is an integer of 1 to x) of the differential stage circuits 29_1 to 29_$x$ has a size ratio (W/L ratio) Aj times a reference size ratio, i.e., has a weighting factor of Aj as an example. The size ratio (W/L ratio) refers to the ratio of a channel width W to a channel length L.

Drain currents Ia_j and Ib_j of the jth differential pair (21_$j$, 22_$j$) are expressed by the following Eqs. (5) and (6).

$$Ia\_j = (Aj \cdot \beta/2) \cdot (Vj - VTH)^2, \text{ and} \quad (5)$$

$$Ib\_j = (Aj \cdot \beta/2) \cdot (Vexp - VTH)^2, \quad (6)$$

where $\beta$ is the gain factor when the transistor has a reference size ratio of 1, and VTH is the threshold voltage of the transistor.

The commonly-connected output ends of the differential stage circuits 29_1 to 29_$x$ are connected to the input (node n22) and the output (node n21) of the current mirror circuit 28, whereby the output currents at the commonly-connected output ends of the differential stage circuits 29_1 to 29_$x$ are controlled to be equal. As a result, the output currents of the differential stage circuits 29_1 to 29_$x$ satisfy the following Eq. (7).

$$Ia\_1 + Ia\_2 + \ldots + Ia\_x = Ib\_1 + Ib\_2 + \ldots + Ib\_x. \quad (7)$$

Eqs. (5) and (6) are expanded within the range of j=1 to x, and the results are substituted into Eq. (7). Assuming that the first-order terms of the threshold voltage VTH on both sides are equal, the substitution yields the following Eqs. (8) and (9).

$$A1 \cdot V1 + A2 \cdot V2 + \ldots + Ax \cdot Vx = (A1 + A2 + \ldots + Ax) \times Vexp, \text{ and} \quad (8)$$

$$Vexp = (A1 \cdot V1 + \ldots + Ax \cdot Vx)/(A1 + \ldots + Ax). \quad (9)$$

As expressed by Eq. (9), the amplifier circuit outputs the value of the sum total of the products of the signal voltages input to the respective differential pairs and the weighting factors, (A1·V1+ . . . +Ax·Vx), divided by the sum total of the weighting factors, (A1+ . . . +Ax), or equivalently, the voltage Vexp corresponding to the weighted average of the signal voltages V1 to Vx as the output voltage Vout. FIG. 1A shows a configuration with differential stage circuits including differential pairs of N-channel transistors and a current mirror circuit including P-channel transistors. However, a configuration with differential stage circuits including differential pairs of P-channel transistors and a current mirror circuit including N-channel transistors, or a configuration with differential stage circuits including differential pairs of N- and P-channel transistors, i.e., of both conduction types and a current mirror circuit may be employed. In any case, Eq. (9) holds true.

Next, a case where the amplifier circuit of FIG. 1A is applied to output amplifier circuits of the decoder circuits included in the foregoing data driver will be described.

FIG. 1B is a chart showing a correspondence between N output terminals T1 to TN of each decoder circuit and the non-inverting input terminals P1 to Px of the amplifier circuit in a case where the differential stage circuits 29_1 to 29_$x$ have the same configuration, i.e., the differential stage circuits are configured to have the same weighting factors.

For example, assume a case where combinations of two voltages including an overlap of the two voltages VA and VB having mutually different voltage values are output from the N (N is an integer of 2 or more) output ports T1 to TN of the decoder circuit, and supply them to the x (note that, x is 2 to the power of (N−1)) non-inverting input terminals of the amplifier circuit with predetermined ratios. At this time, the amplifier circuit of FIG. 1A can output a plurality of voltages obtained by dividing between the two voltages VA and VB into 2 to the power of (N−1), which is "x", based on both voltages.

Specifically, for example, suppose that both "N" and "x" are 2, i.e., the output terminals T1 and T2 of the decoder circuit are associated with the non-inverting input terminals P1 and P2 of the amplifier circuit. In such a case, the weighting factors of the output terminals T1 and T2 are 1:1. If a combination selected from the two different voltages VA and VB is input into the non-inverting input terminals P1 and P2 of the amplifier circuit as voltages V(T1) and V(T2), the amplifier circuit can output a voltage VA, VB, or (VA+VB)/2 depending on which the combination of voltages VA and VB is, (VA, VA), (VB, VB), or (VA, VB). While in the foregoing description the differential stage circuits 29_1 to 29_$x$ of FIG. 1A are described to have the same configuration, the differential stage circuits may be configured to have respective predetermined weights. For example, suppose that "N" is 3 and "x" is 4, i.e., the output terminals T1 to T3 of the decoder circuit are associated with the non-inverting input terminals P1 to P4 of the amplifier circuit. Suppose also that the non-inverting input terminals P3 and P4 are connected in common, so that the weighting factors of the output terminals T1, T2, and T3 are 1:1:2. If a combination selected from the two different voltages VA and VB is input to the non-inverting input terminals of the amplifier circuit as voltages V(T1), V(T2), and V(T3), the amplifier circuit can output one of four voltages obtained by dividing the voltage between the voltages VA and VB, depending on the combination of the voltages VA and VB. Further extensions can be easily made in a similar manner.

Consequently, the digital-to-analog conversion circuit including the amplifier circuit shown in FIG. 1A enables significant reductions in the number of reference voltages generated by the reference voltage generation circuit and the number of switch transistors by which the decoder circuits select the reference voltages. In particular, if the video digital signal has a large number of bits, such a configuration provides an effective means for suppressing an increase in the circuit scale of the digital-to-analog conversion circuit and suppressing an increase in chip area.

As display panels become greater in screen size and higher in resolution these days, load capacitances on the data lines of a display panel for a data driver to drive tend to increase and a driving period (also referred to as a data period) per pixel (display cell) in which the data driver drives the data lines tends to decrease.

As the load capacitances of the data lines increase and the driving period decreases, the data driver needs to drive the data lines more quickly to ensure a charging ratio of a predetermined value or more over the entire data lines. Image quality degradation such as uneven brightness can occur if the charging ratios of the data lines fall below the predetermined value.

For example, in the case of a 4K display panel (the number of data lines: 3840×3, the number of scan lines: 2160) having a frame frequency of 120 Hz, a data period is approximately 3.7 µs. In the case of an 8K display panel with a resolution four times that of a 4K display panel, a data period is 1.85 µs or so. Amplifier circuits can be accelerated to some extent by increasing operation currents to increase the slew rate of the output voltages. However, the speed of change in the input voltages of the amplifier circuits is becoming less and less negligible since a data period is decreasing due to definition enhancement of the display panels. The speed of change in the input voltages of the amplifier circuits affects the speed of change in the output voltages of the amplifier circuits, and a drop in the charging ratios of the data lines (eventually the charging ratios of electrodes in the display cells) leads to a drop in the panel display quality.

AS described above, an amplifier circuit that performs interpolation operation includes a plurality of input terminals, and parasitic capacitances of the plurality of input terminals can affect the speed of change in the input voltages of the amplifier circuit. A description thereof will be given below.

For convenience of description, suppose that the number N of output terminals of each decoder circuit included in the decoder unit is "2", and the number x of non-inverting input terminals of the amplifier circuit is "2". A worst condition leading to a drop in the speed of voltage change is where the same reference voltages are input to both the non-inverting input terminals of the amplifier circuit. Specifically, in the worst condition, one reference voltage selected by the decoder circuit is supplied to both the non-inverting input terminals of the amplifier circuit via the two output terminals.

For example, suppose that the voltages input to the amplifier circuit are a reference voltage VrM in the previous data period, and change to a reference voltage Vr0$a$ lower than the voltage VrM in the next data period. In such a case, the speed of change depends on the following factors: the resistances of the lines transmitting the reference voltage Vr0$a$ and the on resistances of selection switches in the decoder circuit, and the parasitic gate capacitances of the two non-inverting input terminals receiving the reference voltage Vr0$a$ in the amplifier circuit (for example, Cp1 and Cp2 in FIG. 1A).

In a worst-case scenario where the plurality of amplifier circuits corresponding to all the outputs of the data driver, i.e., all the amplifier circuits receive the reference voltage Vr0$a$ at their non-inverting input terminals, the speed of change in the input voltages of the amplifier circuits from VrM to Vr0$a$ decreases because of the time constant of the impedance. This causes a problem of a slow change in the output voltages of the amplifier circuits. The greater the number x of non-inverting input terminals of each amplifier circuit, the greater the delay in the change of the output voltages of the amplifier circuits.

Unlike the case where the same reference voltage is supplied to the plurality of non-inverting input terminals of an amplifier circuit, different reference voltages can be supplied to the plurality of non-inverting input terminals of the amplifier circuit. In such a case, there occurs a problem that the speed of change in the output voltage of the amplifier circuit varies from one gradation level to another. Such problems lead to deterioration in display quality such as low brightness and uneven display.

In view of the foregoing, the present invention is directed to accelerating the processing of a digital-to-analog conversion circuit including an amplifier circuit that performs interpolation operation, and providing a digital-to-analog conversion circuit that can make the speed of change in the output voltage of the amplifier circuit uniform and a data driver of a display apparatus using the same.

SUMMARY

According to one aspect of the present invention, a digital-to-analog conversion circuit includes: a reference voltage generation circuit configured to generate a reference voltage group including a plurality of reference voltages having respective different voltage values; a decoder configured to receive a digital data signal, selects two reference voltages from the reference voltage group in a manner allowing redundancy on the basis of the digital data signal, and outputs the two reference voltages as first and second selection voltages; and an amplifier circuit configured to output a voltage as an output voltage, the voltage being obtained by averaging a plurality of voltages with weighting factors set in advance and amplifying the average, the plurality of voltages each being either the first selection voltage or the second selection voltage. The decoder receives a control signal for giving an instruction to set the decoder to either a first selection state or a second selection state, and if set to the first selection state, selects two different reference voltages from the reference voltage group on the basis of the digital data signal and outputs the two reference voltages as the first and second selection voltages, and if set to the second selection state, selects two reference voltages from the reference voltage group in the manner allowing redundancy on the basis of the digital data signal and outputs the two reference voltages as the first and second selection voltages.

According to another aspect of the present invention, a digital-to-analog conversion circuit includes: a decoder configured to receive a digital data signal, and output first and second voltages having respective different voltage values or a same voltage value on the basis of the digital data signal; and an amplifier circuit configured to output a voltage as an output voltage, the voltage obtained by averaging a plurality of voltages with weighting factors set in advance and amplifying the average, the plurality of voltages each being either one of the first and second voltages. The decoder receives a control signal for giving an instruction to set the decoder to either a first selection state or a second selection state, and if set to the first selection state, outputs two voltages having respective different voltage values based on the digital data signal as the first and second voltages, and if set to the second selection state, outputs either one or both of the two voltages having the respective different voltage values based on the digital data signal as the first and second voltages.

According to yet another aspect of the present invention, a digital-to-analog conversion circuit includes: a reference voltage generation circuit configured to generate a reference voltage group including a plurality of reference voltages having respective different voltage values; a decoder that is connected to the reference voltage generation circuit and configured to select and output first and second selection voltages from the reference voltage group on the basis of a digital data signal; and an amplifier circuit that is connected to the decoder, and configured to output a plurality of output voltages by averaging a plurality of first voltages with respective weighting factors set in advance and amplifying the average, the plurality of first voltages including at least either one of the first and second selection voltages.

According to yet another aspect of the present invention, a data driver includes a digital-to-analog conversion unit configured to receive a video data signal expressing a brightness level by digital data, convert the video data signal into a driving voltage having a voltage value corresponding in magnitude to the brightness level, and supply the driving voltage to a display device. The digital-to-analog conversion unit includes: a reference voltage generation circuit configured to generate a reference voltage group including a plurality of reference voltages having respective different voltage values; a decoder configured to select two reference voltages from the reference voltage group in a manner allowing redundancy on the basis of the video data signal, and output the two reference voltages as first and second selection voltages; and an amplifier circuit configured to output a voltage as the driving voltage, the voltage being obtained by averaging a plurality of voltages with weighting factors set in advance and amplifying the average, the plurality of voltages each being either the first selection voltage or the second selection voltage. The decoder receives a control signal for setting the decoder to either a first selection state or a second selection state, and if set to the first selection state, selects two different reference voltages from the reference voltage group on the basis of the video data signal and outputs the two reference voltages as the first and second selection voltages, and if set to the second selection state, selects two reference voltages from the reference voltage group in a manner allowing redundancy on the basis of the video data signal and outputs the two reference voltages as the first and second selection voltages.

According to yet another aspect of the present invention, a data driver includes a digital-to-analog conversion unit configured to receive a video data signal expressing a brightness level by digital data, convert the video data signal into a driving voltage having a voltage value corresponding in magnitude to the brightness level, and supply the driving voltage to a display device. The digital-to-analog conversion unit includes: a decoder configured to output first and second voltages having respective different voltage values or a same voltage value on the basis of the video data signal; and an amplifier circuit configured to output a voltage as an output voltage, the voltage being obtained by averaging a plurality of voltages with weighting factors set in advance and amplifying the average, the plurality of voltages each being either one of the first and second voltages. The decoder receives a control signal for giving an instruction to set the decoder to either a first selection state or a second selection state, and if set to the first selection state, outputs two voltages having respective different voltage values based on the video data signal as the first and second voltages, and if set to the second selection state, outputs either one or both of the two voltages having the respective different voltage values based on the video data signal as the first and second voltages.

In the present invention, a digital-to-analog conversion circuit including an amplifier circuit that receives a plurality of voltages and performs interpolation operation based on the plurality of voltages uses a decoder to be described below. The decoder is set to either a first selection state or a second selection state on the basis of a control signal, and can switch the selection states.

If the decoder is set to the first selection state, the decoder supplies first and second selection voltages having respective different voltage values to the amplifier circuit on the basis of a digital data signal. On the other hand, if the decoder is set to the second selection state, the decoder supplies first and second selection voltages having respective different voltage values or a same voltage value based on the digital data signal to the amplifier circuit.

As a result, in the first selection state, either one of the two selection voltages having the respective different voltage values is supplied to m (m is an integer of 1 or more) of a plurality of input terminals of the amplifier circuit, and the other selection voltage is supplied to the remaining input terminal(s) of the amplifier circuit, regardless of the contents of the digital data signal.

A delay time occurring due to parasitic capacitances in an input part of the amplifier circuit can thus be reduced, compared to a case with a conventional digital-to-analog conversion circuit where one selection voltage is supplied to all the input terminals of the amplifier circuit regardless of the contents of the digital data signal. This can improve delay in the speed of change in the output voltage of the amplifier circuit in a worst-case scenario, and can make uniform the speeds of change in the output voltage of the amplifier circuit at respective gradation levels. As a result, display quality is improved as well.

BRIEF DESCRIPTION OF THE DRAWINGS

FIG. 6 is a diagram showing operation of a decoder 30 in a first selection state and a second selection state separately;

FIG. 9A is a chart showing suitable specifications for a case where the number N of input terminals of an amplifier circuit 20 is N=2;

FIG. 9B is a chart showing suitable specifications for a case where the number N of input terminals of an amplifier circuit 20 is N=3;

FIG. 10A is a chart showing an example of an operation mode of a second sub decoder 32 in the first selection state;

FIG. 10B is a chart showing an example of the operation mode of the second sub decoder 32 in the second selection state;

FIG. 13A is a chart showing another example of the operation mode of the second sub decoder 32 in the first selection state;

FIG. 13B is a chart showing another example of the operation mode of the second sub decoder 32 in the second selection state;

FIG. 16A is a chart showing a modification of the specifications shown in FIG. 9A;

FIG. 16B is a chart showing a modification of FIG. 10A; and

FIG. 16C is a chart showing a modification of FIG. 10B.

DETAILED DESCRIPTION

Figure 2:
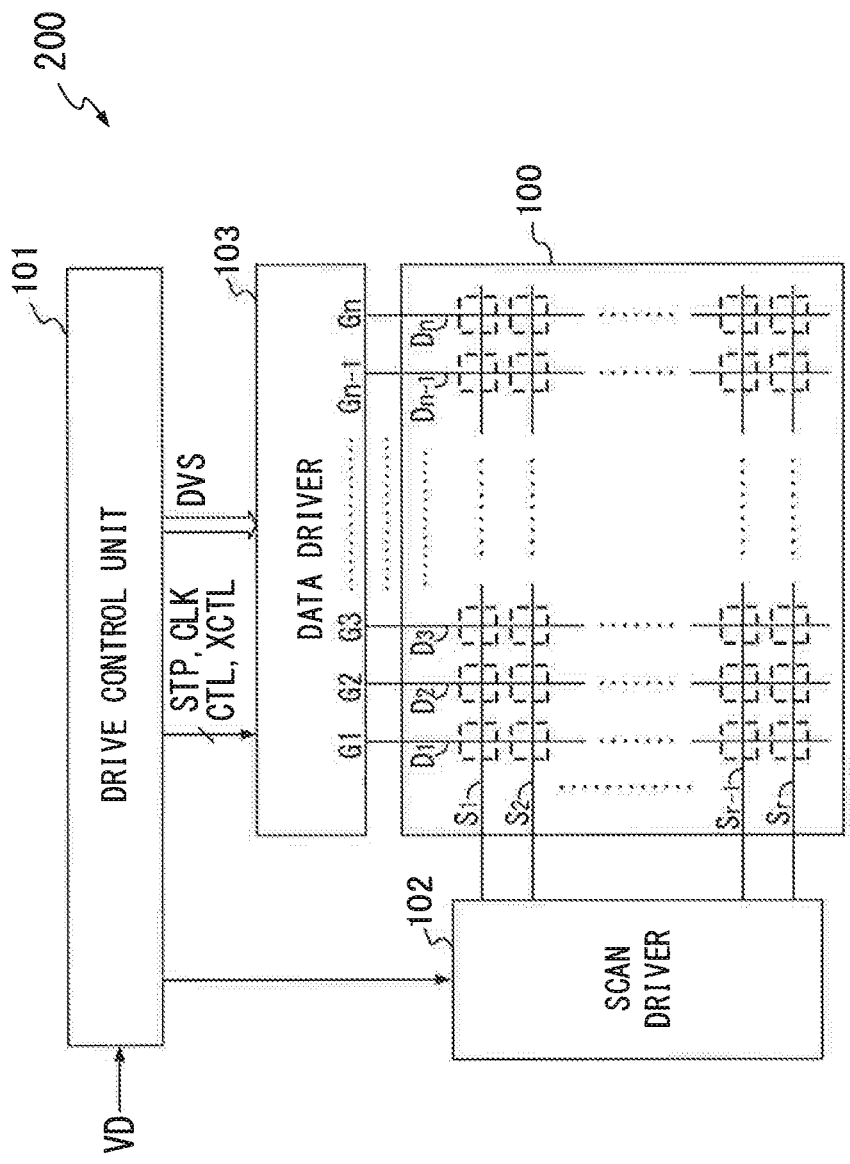
FIG. 2 is a block diagram showing a schematic configuration of a display apparatus 200 including a digital-to-analog conversion circuit and a data driver according to the present invention.

FIG. 2 is a block diagram showing a schematic configuration of a display apparatus 200 including a digital-to-analog conversion circuit and a data driver according to the present invention.

As shown in FIG. 2, the display apparatus 200 includes a display panel 100, a drive control unit 101, a scan driver 102, and a data driver 103.

The display panel 100 includes a liquid crystal or organic EL panel, for example. The display panel 100 includes r (r is a natural number of 2 or more) horizontal scan lines $S_1$ to $S_r$ extending in a horizontal direction of a two-dimensional screen and n (n is a natural number of 2 or more) data lines $D_1$ to $D_n$ extending in a vertical direction of the two-dimensional screen. Display cells serving as pixels are formed at respective intersections of the horizontal scan lines and the data lines.

The drive control unit 101 supplies the scan driver 102 with a scan timing signal for generating horizontal scan pulses to be supplied to the respective scan lines.

The drive control unit 101 further generates a start pulse signal STP, a clock signal CLK, various control signals including control signals CTL and XCTL, and a video digital signal DVS on the basis of a video signal VD, and supplies the generated signals to the data driver 103.

The scan driver 102 applies the horizontal scan pulses in order to the horizontal scan lines $S_1$ to $S_r$ of the display panel 100 on the basis of the scan timing signal supplied from the drive control unit 101.

The video digital signal DVS includes pieces of video data PD each individually expressing the brightness level of a pixel in eight bits, for example. The data driver 103 latches a series of pieces of video data PD on the basis of various control signals (STP, CLK, CTL, and XCTL) supplied from the drive control unit 101. The number of bits of the video data PD is not limited to eight. The data driver 103 converts each series of as many (n) pieces of latched video signal PD as for a horizontal scan line into n driving voltages G1 to Gn having voltage values corresponding in magnitude to brightness levels indicated by the respective pieces of video data PD. The data driver 103 supplies the driving voltages G1 to Gn to the data lines $D_1$ to $D_n$ of the display panel 100, respectively.

Figure 3:
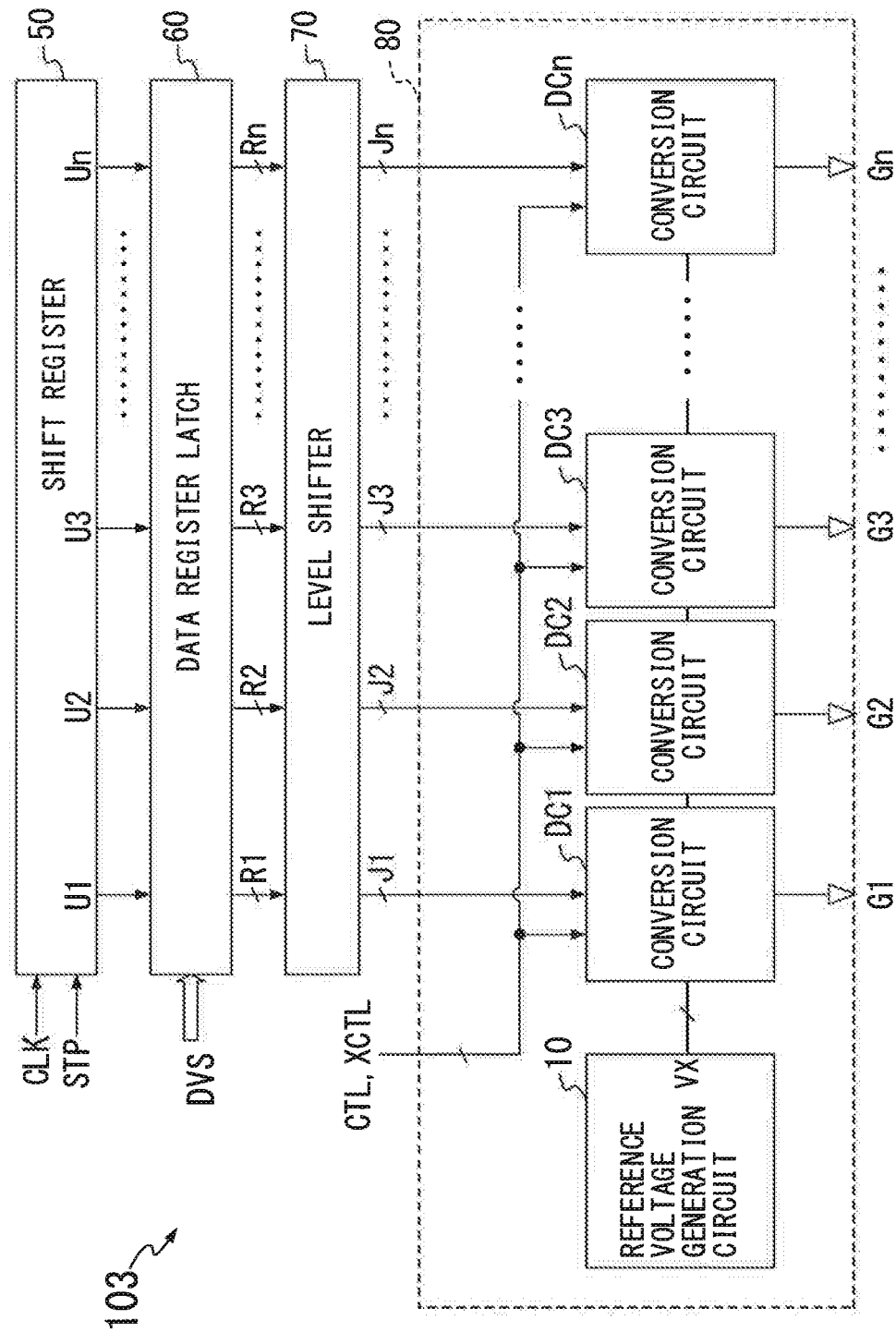
FIG. 3 is a block diagram showing an internal configuration of a data driver 103.

FIG. 3 is a block diagram showing an internal configuration of the data driver 103.

As shown in FIG. 3, the data driver 103 includes a shift register 50, a data register latch 60, a level shifter 70, and a digital-to-analog (DA) conversion unit 80.

The shift register 50 generates latch timing signals U1 to Un on the basis of the start pulse STP supplied from the drive control unit 101, and supplies the latch timing signals U1 to Un to the data register latch 60. The latch timing signals U1 to Un are intended to select a latch in synchronization with the clock signal CLK.

The data register latch 60 sequentially latches the pieces of video data PD supplied from the drive control unit 101 on the basis of the latch timing signals U1 to Un. The data register latch 60 supplies video data signals R1 to Rn representing the respective pieces of video data PD to the level shifter 70 in units of a horizontal scan line (n pieces).

The level shifter 70 performs level shift processing for increasing a signal level on each of the video data signals R1 to Rn, and supplies the resulting n video data signals J1 to Jn to the DA conversion unit 80.

The DA conversion unit 80 receives the video data signals J1 to Jn that are digital data signals. The DA conversion unit 80 converts the video data signals J1 to Jn into the respective driving voltages G1 to Gn having analog voltage values on the basis of the control signals CTL and XCTL, and outputs the driving voltages G1 to Gn.

Figure 4:
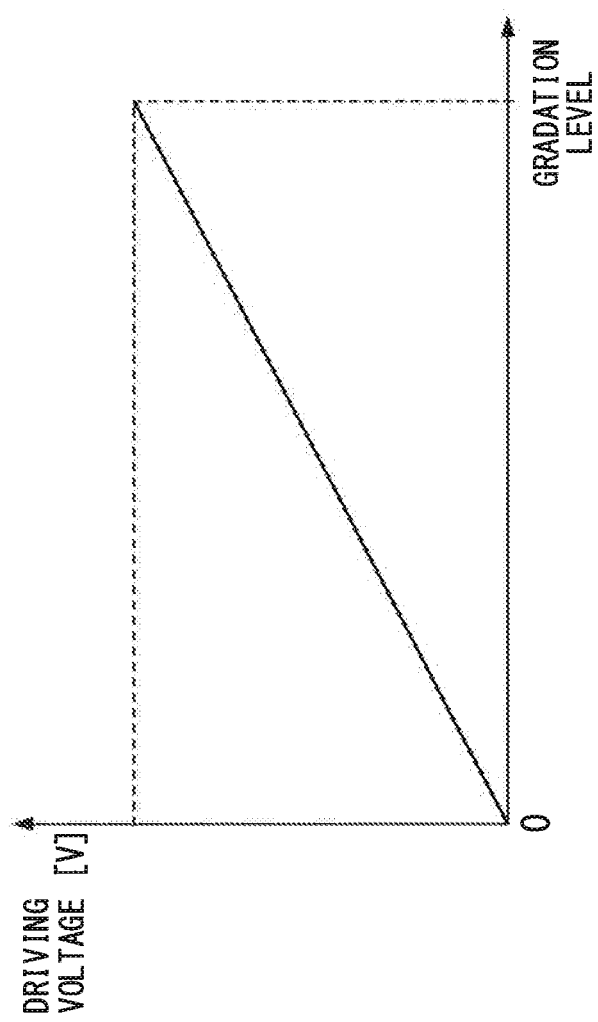
FIG. 4 is a characteristic chart showing an example of a correspondence between the gradation level of brightness expressed by a video data signal that is a digital data signal and a driving voltage.

FIG. 4 is a characteristic chart showing an example of a correspondence between the gradation level of brightness expressed by a video data signal that is a digital data signal and a driving voltage. In the example shown in FIG. 4, the driving voltage to be applied to a data line of the display panel 100 has a linear characteristic with respect to the gradation level of brightness expressed by the video data signal. In the example shown in FIG. 4, the driving voltage varies linearly with respect to the gradation level of brightness expressed by the video data signal. However, the driving voltage may make any variations that can be linearly approximated within a predetermined interval of gradation levels. The gradient may vary interval by interval. If the variations of the driving voltage with respect to the gradation level have an interval or intervals of nonlinear characteristic aside from one of linear characteristic, the present invention can be applied to only the interval of linear characteristic.

As shown in FIG. 3, the DA conversion unit 80 includes a reference voltage generation circuit 10 and conversion circuits DC1 to DCn.

The reference voltage generation circuit 10 generates a reference voltage group VX including a plurality of reference voltages having respective different voltage values, and supplies the reference voltage group VX to each of the conversion circuits DC1 to DCn.

The conversion circuits DC1 to DCn individually receive the video data signals J1 to Jn, respectively. The conversion circuits DC1 to DCn select reference voltages having voltage values corresponding to the respective video data signals J1 to Jn from among the reference voltage group VX on the basis of the control signals CTL and XCTL. The conversion circuits DC1 to DCn generate the driving voltages G1 to Gn from the respective selected reference voltages, and output the driving voltages G1 to Gn. As shown in FIG. 3, the conversion circuits DC1 to DCn are arranged to correspond to the video data signals J1 to Jn, respectively, and have the same internal configuration.

First Embodiment

Figure 5:
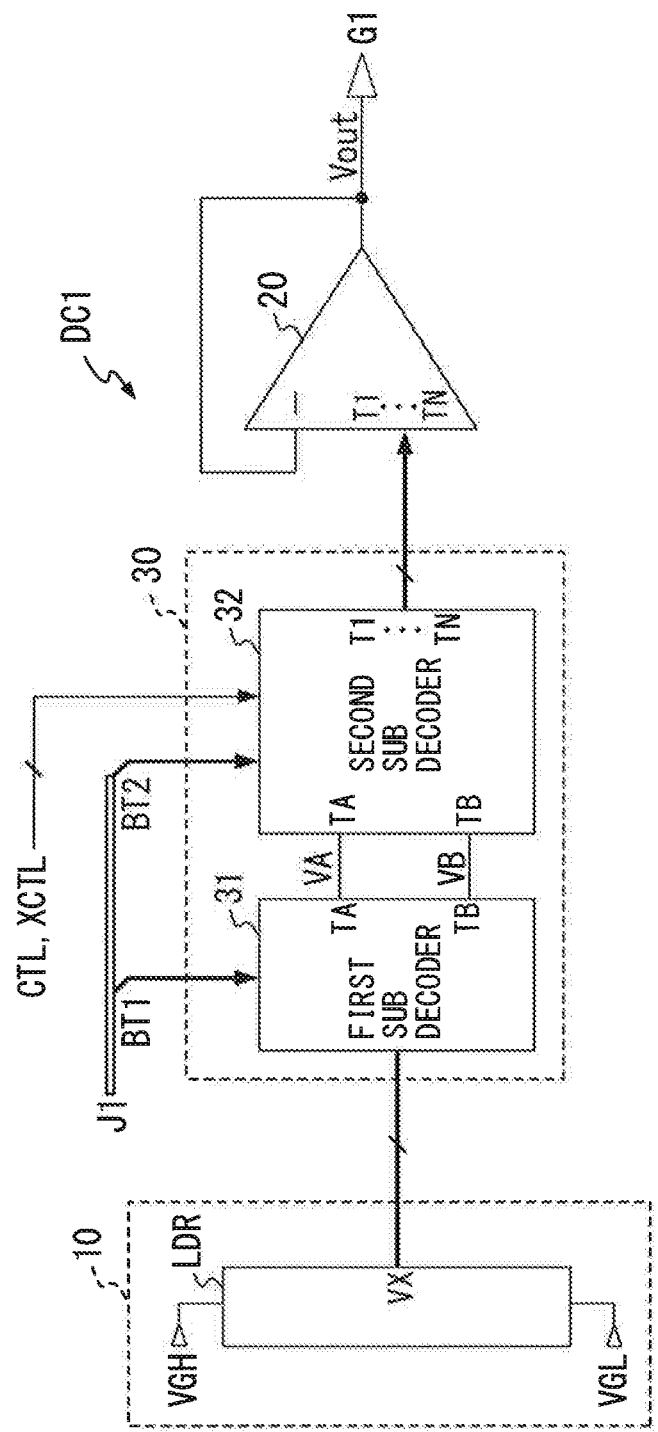
FIG. 5 is a block diagram showing an example of a configuration of a digital-to-analog conversion circuit according to the present invention.

FIG. 5 is a block diagram showing an example of a configuration of a digital-to-analog conversion circuit according to the present invention, including the conversion circuit DC1 extracted from the conversion circuits DC1 to DCn shown in FIG. 3 and the reference voltage generation circuit 10.

The reference voltage generation circuit 10 includes a ladder resistor LDR, for example. The ladder register LDR receives a predetermined potential VGH and a potential VGL lower than the potential VGH, and divides the voltage between the potentials VGH and VGL into a plurality of voltages having respective different voltage values. The reference voltage generation circuit 10 generates the plurality of voltages divided by the ladder resistor LDR as the reference voltage group VX, and supplies the reference voltage group VX to each of the conversion circuits DC1 to DCn.

The conversion circuit DC1 includes an amplifier circuit 20 and a decoder 30.

The decoder 30 receives the reference voltage group VX, the control signals CTL and XCTL for giving an instruction to set the decoder 30 to either a first selection state or a second selection state, and the video data signal J1 that is an 8-bit digital data signal, for example.

If the control signals CTL and XCTL indicating the first selection state are received, the decoder 30 selects two different reference voltages VA and VB from the reference voltage group VX on the basis of the video data signal J1. The decoder 30 then outputs the two selected reference voltages VA and VB as first and second selection voltages, respectively. If the control signals CTL and XCTL indicating the second selection state are received, the decoder 30 selects two reference voltages from the reference voltage group VX in a manner allowing redundancy on the basis of the video data signal J1. The decoder 30 then outputs either one or both of the two selected reference voltages as the first and second selection voltages.

For example, the decoder 30 includes a first sub decoder 31 and a second sub decoder 32 as shown in FIG. 5.

The first sub decoder 31 receives a first bit signal group BT1 and the reference voltage group VX. For example, the first bit signal group BT1 is an upper bit group including the most significant bit of the video data signal J1. The first sub decoder 31 selects two different reference voltages from the reference voltage group VX on the basis of the first bit signal group BT1, and supplies the two selected reference voltages as the selection voltages VA and VB to the second sub decoder 32 via terminals TA and TB, respectively.

The second sub decoder 32 receives a second bit signal group BT2, the control signals CTL and XCTL, and the selection voltages VA and VB. For example, the second bit signal group BT2 is a lower bit group including the least significant bit of the video data signal J1. On the basis of the second bit signal group BT2 and the control signals CTL and XCTL, the second sub decoder 32 supplies either one or both of the selection voltages VA and VB as the first and second selection voltages to the amplifier circuit 20.

Figures 1A, 1B:
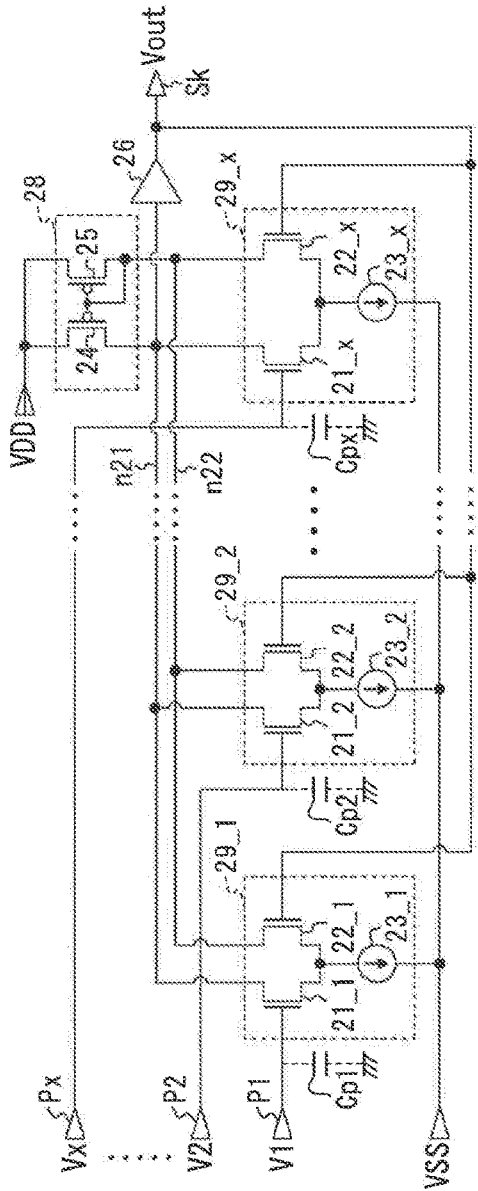
FIG. 1A is a circuit diagram showing a configuration of an amplifier circuit that performs interpolation operation.
FIG. 1B is a chart showing a correspondence between N output terminals T1 to TN of a decoder circuit, non-inverting input terminals P1 to Px of the amplifier circuit, and weighting factors.

The amplifier circuit 20 includes a differential amplifier, or so-called operational amplifier, including first to Nth (N is an integer of 2 or more) terminals T1 to TN as non-inverting input terminals. For example, an amplifier circuit shown in FIG. 1A can be used.

The N voltages received at the terminals T1 to TN are either the first selection voltage or the second selection voltage each. The amplifier circuit 20 averages the N voltages with weighting factors set for the respective terminals T1 to TN in advance, amplifies the average, and outputs the resulting voltage as an output voltage Vout. The amplifier circuit 20 included in the conversion circuit DC1 here outputs the output voltage Vout as the driving voltage G1.

The selection voltage VA and VB are desirably a combination of voltages having adjoining voltage values or voltages having a small difference in voltage value among the reference voltage group VX.

The operation of the decoder 30 (sub decoders 31 and 32) shown in FIG. 5 will be described below.

FIG. 6 is a chart showing the operation of the decoder 30 in the first selection state and the second selection state separately.

For example, in FIG. 6, the control signals CTL and XCTL will be described to indicate the first selection state if CTL=0 (low level in logical value), and the second selection state if CTL=1 (high level in logical value). The control signal XCTL is a complementary signal to the control signal CTL. Suppose that the number N of input terminals of the amplifier circuit 20 and the number m of terminals to be described below are m≥1 and N≥2, and the selection voltages VA and VB satisfy VA≠VB.

In the first selection state (CTL=0), the decoder 30 selects two different, non-redundant reference voltages VA and VB from the reference voltage group VX on the basis of, for example, the 8-bit video data signal J1 that is a digital data signal. The decoder 30 uses the two different reference voltages as the voltage VA serving as the first selection voltage and the voltage VB serving as the second selection voltage. The decoder 30 selectively supplies the first selection voltage VA to m (m is an integer of 1 or more) of the terminals T1 to TN of the amplifier circuit 20, and selectively supplies the second selection voltage VB to the remaining (N−m) of the terminals T1 to TN.

In the second selection state (CTL=1), the decoder 30 selects two reference voltages in a manner allowing redundancy from the reference voltage group VX as the voltage VA or VB serving as the first selection voltage and the voltage VA or VB as the second selection voltage on the basis of the video data signal J1. The decoder 30 supplies the voltage VA or VB as the first or second selection voltage to each of the terminals T1 to TN of the amplifier circuit 20. Here, the decoder 30 can supply only the voltage VA or only the voltage VB to the terminals T1 to TN of the amplifier circuit 20.

Figure 7:
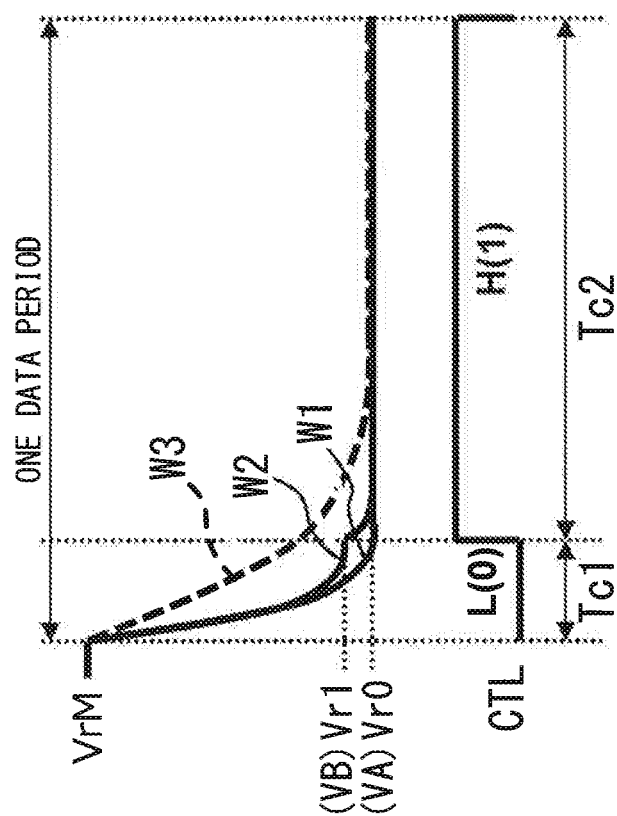
FIG. 7 is a diagram showing examples of waveforms of selection voltages that the decoder 30 supplies to terminals T1 to TN of an amplifier circuit 20 in each of the first and second selection states.

FIG. 7 is a diagram showing an example of the waveforms of the first and second selection voltages that the decoder 30 supplies to the terminals T1 to TN of the amplifier circuit 20 in the configuration shown in FIG. 5 in each of the first and second selection states indicated by the control signals CTL and XCTL. FIG. 7 shows a data period between when the decoder 30 receives a video data signal for one pixel to when the decoder 30 outputs the selection voltages corresponding to the video data signal.

As shown in FIG. 7, one data period includes a first period Tc1 and a second period Tc2 subsequent to the first period Tc1. In the first period Tc1, the control signal CTL=0 (low level: L). The decoder 30 is thus set to the first selection state. In the second period Tc2, the control signal CTL=1 (high level: H). The decoder 30 is thus set to the second selection state. Since the control signal XCTL is a complementary signal to the control signal CTL, a description thereof is omitted.

In FIG. 7, solid-lined waveforms W1 and W2 in the period Tc1 are the output waveforms of selection voltages output from the decoder 30 in the first selection state. A broken-lined waveform W3 is the output waveform of a conventional decoder, i.e., a decoder that maintains the foregoing second selection state for one data period. FIG. 7 shows an example of a worst-case scenario where all the n outputs of the data driver make the same operation in a data period where a maximum selection voltage VrM is switched to a minimum selection voltage Vr0.

The broken-lined waveform W3 changes from the selection voltage VrM selected in the immediately previous data period to the selection voltage Vr0 within one data period. The conventional decoder selects the selection voltage Vr0 and supplies the selection voltage Vr0 to the terminals T1 to TN of the amplifier circuit 20 for one data period. Since the input capacitances (parasitic gate capacitances of differential pair transistors) of the amplifier circuit 20 serve as a load, the speed of voltage change of the broken-lined waveform W3 depends on a time constant even including the resistance of the wiring transmitting the selection voltage Vr0 and the impedance of the decoder itself.

In the present embodiment, in the first period Tc1 immediately after the beginning of a data period, the decoder 30 is set to the first selection state (CTL=0). Different two voltages (VA, VB)=(Vr0, Vr1) are selected as the first and second selection voltages. Suppose, for example, that the selection voltage Vr1 is a voltage next to the selection voltage Vr0, e.g., a voltage one level higher than Vr0. The decoder 30 outputs the selection voltage Vr0 to m of the terminals T1 to TN of the amplifier circuit 20, and supplies the selection voltage Vr1 to (N−m) of the terminals T1 to TN. The voltages of the solid-lined waveforms W1 and W2 on the terminals to which the selection voltages Vr0 and Vr1 are supplied, respectively, change faster than that of the broken-lined waveform W3 since the input capacitance of the amplifier circuit 20 connected to one reference voltage line decreases. Predetermined weighting factors are set for the terminals T1 to TN of the amplifier circuit 20, and the amplifier circuit 20 outputs a voltage between the selection voltages Vr0 and Vr1, or more specifically, a weighted average voltage corresponding to the weighting factors. The closer to 1:1 the weighting factors of the selection voltages Vr0 and Vr1, the closer the voltage changes of the waveforms W1 and W2 and the faster the voltage changes.

In the second period Tc2, the decoder 30 is set to the second selection state (CTL=1). The selection voltage Vr0 corresponding to the video data signal J1 is selected as the first and second selection voltages. The decoder 30 supplies the selection voltage Vr0 to the terminals T1 to TN of the amplifier circuit 20. The terminals to which the selection voltage Vr1 is supplied in the first period Tc1 are switched and supplied with the selection voltage Vr0. The terminals are quickly switched since the potential difference between the selection voltages Vr0 and Vr1 is small. Receiving the inputs of the selection voltage Vr0, the amplifier circuit 20 amplifies the selection voltage Vr0 and outputs the amplified voltage.

As described above, in the present embodiment, one data period is divided into the period Tc1 of the first selection state and the period Tc2 of the second selection state by the control signals CTL and XCTL. When in the first selection state (Tc1), the decoder 30 supplies a selection voltage group including reference voltages having respective different voltage values to the amplifier circuit 20. When in the second selection state (Tc2), the decoder 30 supplies a selection voltage group including reference voltages having the same voltage value or respective different voltage values based on the digital data signal (J1) to the amplifier circuit 20. This can increase the speed of change in the input voltages of the amplifier circuit 20, and can increase the speed of change in the output voltage of the amplifier circuit 20 accordingly. By performing the same control on all the gradation levels, the speeds of change in the output voltage of the amplifier circuit 20 at the respective gradation levels can be made uniform.

A detailed operation of the data driver 103 including the conversion circuits DC1 to DCn having the configuration shown in FIG. 5 will be described below with reference to FIG. 8 by using an example where the number N of input terminals of the amplifier circuit 20 and the foregoing "m" are N=2 and m=1.

Figure 8:
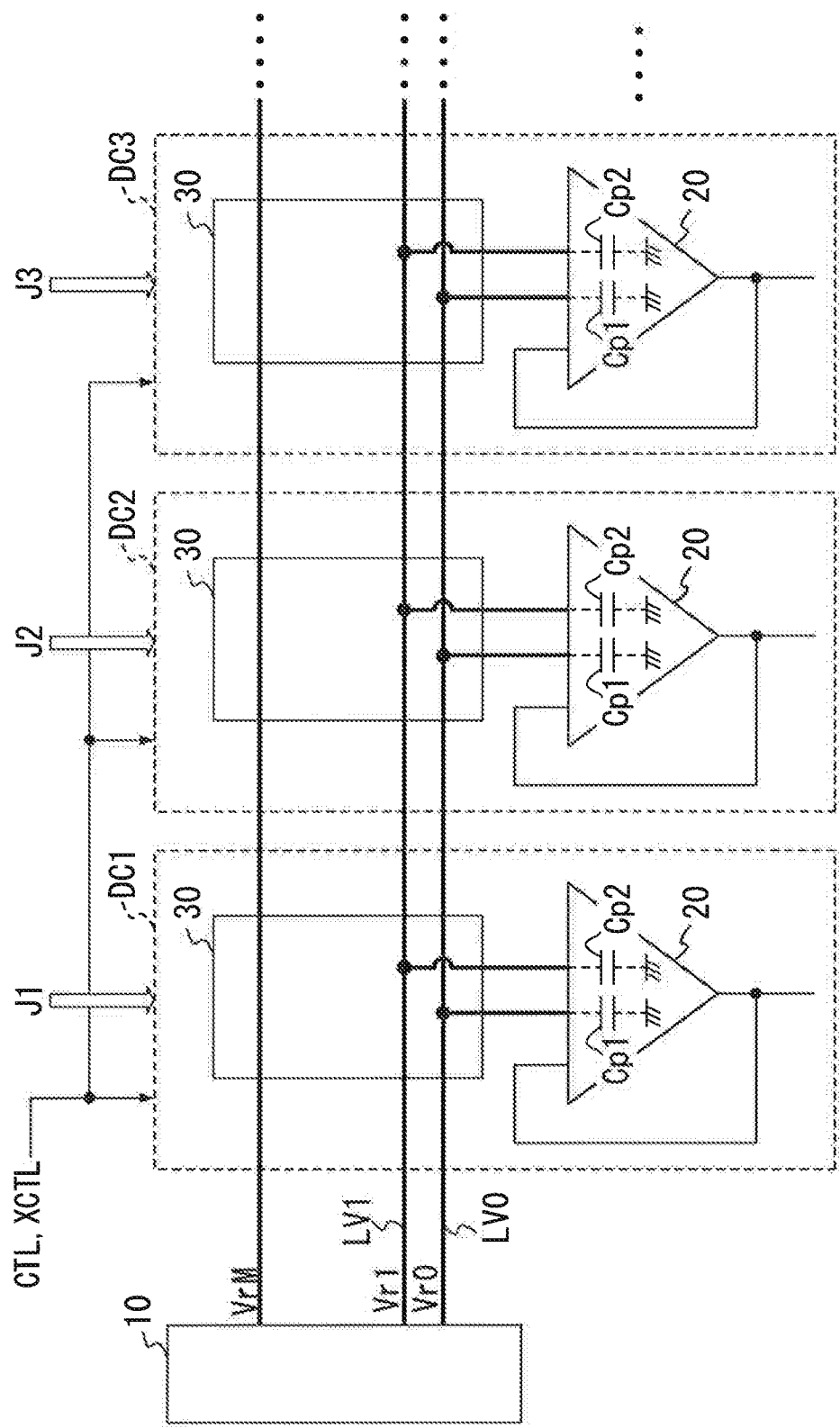
FIG. 8 is a diagram schematically showing the states of amplifier circuits 20 and decoders 30 included in respective conversion circuits in a first period Tc1, where a reference voltage generation circuit 10 and conversion circuits DC1 to DC3 are extracted.

FIG. 8 is a diagram schematically showing in an extracted manner the states of the amplifier circuits 20 and the decoders 30 in the conversion circuits DC1 to DC3 among the conversion circuits DC1 to DCn and the reference voltage generation circuit 10 in the first period Tc1.

In the first period Tc1, the decoders 30 in the respective conversion circuits DC are set to the first selection state. In the example shown in FIG. 8, in the first period Tc1, the decoders 30 supply the two different selection voltages Vr0 and Vr1 having a small potential difference therebetween to the plurality of input terminals of the respective n amplifier circuits 20 corresponding to all the outputs of the data driver 103. Here, the parasitic capacitors Cp1 on the input terminals that receive the selection voltage Vr0 in the respective amplifier circuits 20 are connected to a line LV0. The parasitic capacitors Cp2 on the input terminals that receive the selection voltage Vr1 in the respective amplifier circuits 20 are connected to a line LV1. The lines LV0 and LV1 are different lines, i.e., not electrically connected to each other. This reduces the total parasitic capacitance connected to each of the lines LV0 and LV1, compared to a case where the line LV0 or LV1 is connected to both the parasitic capacitors Cp1 and Cp2 on the input terminals of all the amplifier circuits in the first period Tc1 like a conventional decoder. The changes in the voltages of the input terminals are thus accelerated accordingly. After the voltages received by the input terminals of the amplifier circuits have sufficiently approached Vr0 and Vr1 in the first period Tc1, the operation state is restored to the same state as in the conventional decoder in the second period Tc2.

The changes in the input voltages of the amplifier circuits in one data period can thus be accelerated even in a worst-case scenario where all the input terminals of the n amplifier circuits 20 corresponding to all the outputs are connected to either one of the lines LV0 and LV1 in the second period Tc2. In addition, the speeds of change in the input voltages of the amplifier circuits at respective gradation levels can be made uniform. As a result, the changes in the output voltages of the amplifier circuits can be accelerated, and the speeds of change in the output voltages at respective gradation levels can be made uniform.

Second Embodiment

FIG. 9A and 9B are charts showing examples of operation of the decoder 30 when in the foregoing second selection state (Tc2) as examples of specifications suitable for the digital-to-analog conversion circuit (10, DC1) according to the present invention.

FIG. 9A is a chart showing suitable specifications for a case where the number N of input terminals of an amplifier circuit 20 is N=2. FIG. 9B is a chart showing suitable specifications for a case where N=3. Both FIGS. 9A and 9B show a relationship between the reference voltage Vref selected by the decoder 30, bit codes (bits D3 to D0, or D4 to D0) of the digital data signal, and the selection voltages V(T1) to V(TN) input to the terminals T1 to TN of the amplifier circuit 20, in association with levels expressing the voltage values of the output voltage stepwise. A level or levels between two adjoining reference voltages (Vref) has/have a linear characteristic due to interpolation calculation of the amplifier circuit. For the convenience of illustration, FIGS. 9A and 9B show up to 15 levels and 24 levels, respectively, whereas the number of levels can be further extended. Extending the number of levels increases the number of bits of the corresponding digital data signal.

With the specifications of FIG. 9A, the decoder selects the same reference voltages for the selection voltages V(T1) and V(T2) to be supplied to the terminals T1 and T2 of the amplifier circuit 20 at the end of a data period at every two levels (such as levels 0, 2, and 4). At each of levels to come between every two levels (such as levels 1 and 3), the decoder selects two reference voltages respectively selected at the higher and lower two adjoining levels, and outputs the two reference voltages as the selection voltages V(T1) and V(T2). By contrast, while in the first selection state (Tc1), the decoder selects, at each level, the reference voltage corresponding to that level and a reference voltage having a voltage value one level higher or lower than that of the reference voltage. The decoder supplies the two reference voltages as the selection voltages V(T1) and V(T2) to the terminals T1 and T2 of the amplifier circuit 20. The number of reference voltages for the reference voltage generation circuit 10 to generate can thus be reduced to ½ the number of possible voltage values of the output voltage of the amplifier circuit.

With the specifications of FIG. 9B, the decoder selects the same reference voltages for the selection voltages V(T1) to V(T3) to be supplied to the terminals T1 to T3 of the amplifier circuit 20 at the end of a data period at every four levels (such as at levels 0, 4, and 8). At each of levels to come between every four levels (such as levels 1 to 3 and 5 to 7), the decoder selects two reference voltages selected at the higher and lower two levels adjoining the level. The decoder then assigns the two reference voltages to the selection voltages V(T1) to V(T3) on the basis of the bit codes, and outputs the resulting selection voltages V(T1) to V(T3). By contrast, while in the first selection state (Tc1), the decoder selects, at each level, the reference voltage corresponding to that level and a reference voltage having a voltage value one level higher or lower than that of the reference voltage. The decoder assigns the reference voltages to the selection voltages V(T1) to V(T3) at predetermined ratios, and supplies the resulting selection voltages V(T1) to V(T3) to the terminals T1 to T3 of the amplifier circuit 20. The number of reference voltages for the reference voltage generation circuit 10 to generate can thus be reduced to ¼ the number of possible voltage values of the output voltage of the amplifier circuit.

In the foregoing examples, the reference voltages selected by the decoder while the decoder is set to the first selection state (Tc1) are the reference voltage corresponding to the level of the output voltage and a reference voltage having a voltage value closest to that of the reference voltage. However, this is not restrictive.

For example, suppose that the voltage (referred to as a current output voltage) for the amplifier circuit 20 to output in the current data period is lower than the voltage (referred to as an immediately previous output voltage) for the amplifier circuit 20 to output in the immediately previous data period. In such a case, the decoder selects two different reference voltages lower than the immediately previous output voltage while in the first selection state. On the other hand, if the current output voltage is higher than the immediately previous output voltage, the decoder selects two different reference voltages higher than the immediately previous output voltage while in the first selection state.

Suppose that a conventional decoder is in a worst-case scenario where the input terminals of the amplifier circuits 20 corresponding to all the outputs are connected to the same line. In such a case, the impedance of the line becomes maximum, and the voltage changes at the inputs of the amplifier circuits 20 become the slowest. This can cause a delay in the speed of change in the output voltages of the amplifier circuits 20. In the present embodiment, as shown in FIGS. 9A and 9B, there are gradation levels at which the input terminals of an amplifier circuit 20 are connected to the same reference voltage line (for example, even-numbered levels in FIG. 9A) and gradation levels at which the input terminals of the amplifier circuit 20 are connected to different reference voltage lines (for example, odd-numbered levels in FIG. 9A). In other words, the impedance of a line varies depending on the gradation level. The speed of voltage change at each input terminal of the amplifier circuit 20 thus differs from one level to another. Such level-to-level differences in the speed of voltage change also affect the brightness characteristics of the display apparatus depending on the gradation level, and cause a drop in display quality.

In the present invention, the decoder is switched from the first selection state (period Tc1) to the second selection state (period Tc2) within a data period. Such control can accelerate the voltage changes of the input terminals of the amplifier circuit 20 in the initial period TC1. The present invention can thus increase the speed of change in the output voltage of the amplifier circuit 20. With the specifications shown in FIG. 9A and 9B, the input terminals of the amplifier circuit 20 are connected to different reference voltage lines at all gradation levels in the initial period Tc1. Level-to-level differences in the speed of voltage change between the input terminals of the amplifier circuit 20 are thereby suppressed. This can prevent a drop in display quality.

The number N of input terminals of the amplifier circuit 20 can be extended. For example, specifications can be extended so that the number N of input terminals is N=4, the weighting factors of the four terminals T1, T2, T3, and T4 are 1:1:2:4, and the output voltage Vout is given by:

$$Vout=[V(T1)+V(T2)+2 \times V(T3)+4\times V(T4)]/8.$$

With such specifications, reference voltages are provided for every eight levels, and two different reference voltages are supplied to the four input terminals of the amplifier circuit 20 on the basis of bit codes. So, the present invention can also accelerate the change speed of the output voltage of the amplifier circuit 20 with the number N of the input terminals as described above, by the control where the decoder is switched from the first selection state (first-period Tc1) to the second selection state in the one data period.

Third Embodiment

FIGS. 10A and 10B are charts showing an example of operation of the second sub decoder 32 in the first and second selection states, respectively, in a case where the number N of input terminals of the amplifier circuit 20 is N=2 according to the specifications of FIG. 9A.

In FIGS. 10A and 10B, the amplifier circuit 20 is assumed to include two terminals T1 and T2 as its input terminals. The second sub decoder 32 is assumed to receive bits D0 and XD0, which represent the least significant bit of the video data signal J1, as the second bit signal group BT2.

The second sub decoder 32 receives two different voltages VA and VB selected by the first sub decoder 31, and controls the selection voltages to be supplied to the terminals T1 and T2 of the amplifier circuit 20 on the basis of the control signal CTL and the bits D0 and XD0 representing the least significant bit of the video data signal J1. In FIGS. 10A and 10B, the complementary signals XCTL and XD0 of the signals CTL and D0 are omitted. The weighting factors of the two terminals T1 and T2 of the amplifier circuit 20 are set to 1:1.

Suppose that the decoder 30 is set to the first selection state on the basis of the control signal CTL=0 (low level). In such a case, as shown in FIG. 10A, the second sub decoder 32 supplies two selection voltages VA and VB having respective different voltage values to the terminals T1 and T2 of the amplifier circuit 20, respectively, regardless of the value of the bit D0. Here, the amplifier circuit 20 receives the selection voltages VA and VB at the terminals T1 and T2 with weights of 1:1, and outputs a weighted average voltage (VA+VB)/2 on the basis of the weights. In the first selection state, the voltages of the terminals T1 and T2 thus change quickly. In the first selection state, the output voltage changes at uniform speed since the output voltages at the two gradation levels determined by the code of the bit D0 are the same.

Suppose that the decoder 30 is set to the second selection state on the basis of the control signal CTL=1 (high level). As shown in FIG. 10B, if the bit D0=0, the second sub decoder 32 supplies only one of the selection voltages VA and VB, namely, the selection voltage VA to both the terminals T1 and T2 of the amplifier circuit 20. Here, the amplifier circuit 20 outputs the voltage VA. Suppose that the decoder 30 is set to the second selection state on the basis of the control signal CTL=1 (high level). As shown in FIG. 10B, if the bit D0=1, the second sub decoder 32 supplies the voltages VA and VB to the terminals T1 and T2 of the amplifier circuit 20, respectively. Here, the amplifier circuit 20 outputs a voltage (VA+VB)/2 obtained by averaging the voltages VA and VB with weights as the output voltage.

As described above, in the present embodiment, one data period in which a voltage based on the digital data signal (J1) is output includes the first period Tc1 of the first selection state and the second period Tc2 of the second selection state. In the first period Tc1, the voltage changes of the input terminals of the amplifier circuit 20 are accelerated even if the voltage changes are large. More specifically, in the initial first period Tc1, the second sub decoder 32 performs processing for increasing the speed of change in the output voltage of the amplifier circuit 20 toward the voltage corresponding to the digital data signal or a voltage near the voltage. The second sub decoder 32 further makes the speed of change in the output voltage uniform, and in the subsequent second period Tc2, stably drives the amplifier circuit 20 to the voltage corresponding to the digital data signal.

Figure 11:
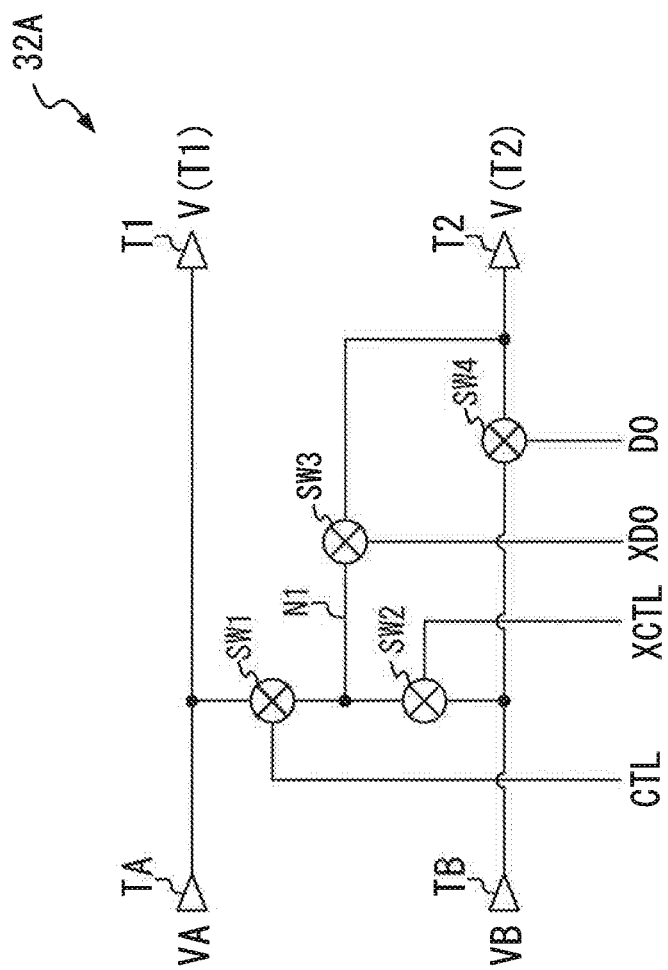
FIG. 11 is a circuit diagram showing an example of an internal configuration of a second sub decoder 32A that is another embodiment of the second sub decoder 32.

FIG. 11 is a circuit diagram showing an example of an internal configuration of a second sub decoder 32A that is the second sub decoder 32 configured to operate in the operation modes of FIGS. 10A and 10B.

The second sub decoder 32A includes terminals TA and TB for receiving respective different selection voltages VA and VB, Nch (N-channel) transistor switches SW1 to SW4, and terminals T1 and T2 serving as output terminals.

The second sub decoder 32A outputs the selection voltage VA received at the terminal TA simply as V(T1) via the terminal T1. The switch SW1 turns on if the control signal CTL=1 (high level), and supplies the selection voltage VA received at the terminal TA to the switch SW3 via a node N1. The switch SW2 turns on if the inverted control signal XCTL=1 (high level), and supplies the selection voltage VB received at the terminal TB to the switch SW3 via the node N1. The switch SW3 turns on if the inverted bit XD0=1 (high level), and outputs the selection voltage VA or VB supplied from the switch SW1 or SW2 as V(T2) via the terminal T2. The switch SW4 turns on if the bit D0=1 (high level), and outputs the selection voltage VB received at the terminal TB as V(T2) via the terminal T2.

Figure 12:
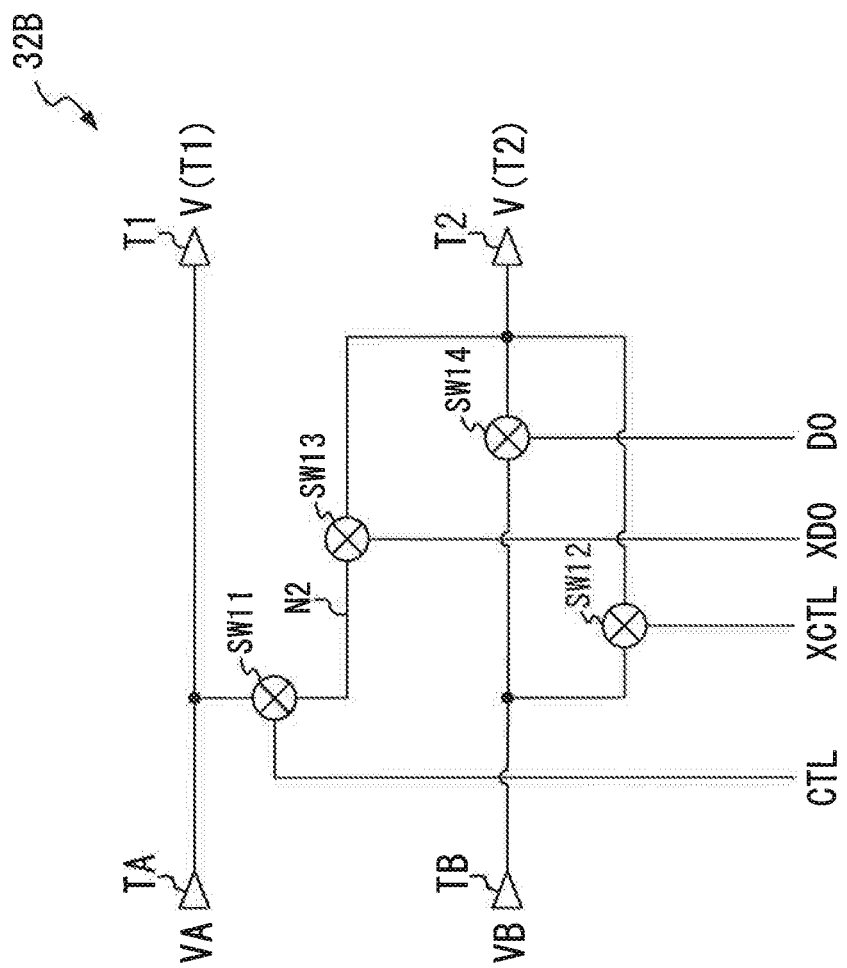
FIG. 12 is a circuit diagram showing an example of an internal configuration of a second sub decoder 32B that is another embodiment of the second sub decoder 32.

FIG. 12 is a circuit diagram showing a configuration of a second sub decoder 32B that is a modification of the second sub decoder 32A shown in FIG. 11.

The second sub decoder 32B includes terminals TA and TB for receiving respective different selection voltages VA and VB, Nch transistor switches SW11 to SW14, and terminals T1 and T2 serving as output terminals.

Like the second sub decoder 32A, the second sub decoder 32B outputs the selection voltage VA received at the terminal TA simply as V(T1) via the terminal T1.

The switch SW11 turns on if the control signal CTL=1 (high level), and supplies the selection voltage VA received at the terminal TA to the switch SW13 via a node N2. The switch SW13 turns on if the inverted bit XD0=1 (high level), and outputs the selection voltage VA supplied from the switch SW11 as V(T2) via the terminal T2. The switch SW12 turns on if the inverted control signal XCTL=1 (high level), and outputs the selection voltage VB received at the terminal TB as V(T2) via the terminal T2. The switch SW14 turns on if the bit D0=1 (high level), and outputs the selection voltage VB received at the terminal TB as V(T2) via the terminal T2.

Fourth Embodiment

FIGS. 13A and 13B are charts showing examples of the operation modes of the second sub decoder 32 in the first and second selection states in a case where the number N of input terminals of the amplifier circuit 20 is N=3 according to the specifications of FIG. 9B.

In FIGS. 13A and 13B, the amplifier circuit 20 is assumed to include three terminals T1 to T3 as input terminals. The second sub decoder 32 is assumed to receive bits D0, XD0, D1, and XD1 that are a lower bit group of the video data signal J1 as the second bit signal group BT2.

The second sub decoder 32 receives two different voltages VA and VB selected by the first sub decoder 31, and controls selection voltages to be supplied to the terminals T1 to T3 of the amplifier circuit 20 on the basis of the control signal CTL and the bits D0, XD0, D1, and XD1 included in the video data signal J1. In FIGS. 13A and 13B, the signals XCTL, XD0, and XD1 that are complementary signals to the signals CTL, D0, and D1 are omitted. The weighting factors to the terminals T1 to T3 of the amplifier circuit 20 are set to 1:1:2.

Suppose that the decoder 30 is set to the first selection state on the basis of the control signal CTL=0 (low level). In such a case, as shown in FIG. 13A, the second sub decoder 32 selectively supplies one of the two selection voltages VA and VB having respective different voltage values, namely, the selection voltage VA to both the terminals T1 and T2 of the amplifier circuit 20 regardless of the values of the bits D0 and D1. Here, the second sub decoder 32 further supplies the other of the selection voltages VA and VB, namely, the selection voltage VB to the terminal T3 of the amplifier circuit 20. The amplifier circuit 20 receives the selection voltage VA and the selection voltage VB at the terminals T1 and T2 and the terminal T3 with weights of 1:1, and outputs a weighted average voltage (VA+VB)/2 on the basis of the weights. In the first selection state, the voltages of the terminals T1 to T3 thus change quickly compared to when the same selection voltage is supplied to all the terminals T1 to T3 in common. In the first selection state, the output voltages at the four gradation levels determined by the code of the bits D1 and D0 are the same. The speeds of change in the output voltages are thereby made uniform.

As shown in FIG. 13B, if the decoder 30 is set to the second selection state on the basis of the control signal CTL=1 (high level) and the bits D1 and D0 indicate (0, 0), the second sub decoder 32 supplies only the voltage VA to the terminals T1, T2, and T3. As a result, the amplifier circuit 20 outputs the voltage VA. If the bits D1 and D0 indicate (0, 1), the second sub decoder 32 supplies the voltages VA, VB, and VA to the terminals T1, T2, and T3, respectively. As a result, the amplifier circuit 20 outputs a voltage (3VA+VB)/4. If the bits D1 and D0 indicate (1, 0), the second sub decoder 32 supplies the voltages VA, VA, and VB to the terminals T1, T2, and T3, respectively. As a result, the amplifier circuit 20 outputs a voltage (VA+VB)/2. If the bits D1 and D0 indicate (1, 1), the second sub decoder 32 supplies the voltages VA, VB, and VB to the terminals T1, T2, and T3, respectively. As a result, the amplifier circuit 20 outputs a voltage (VA+3VB)/4.

As described above, one data period in which a voltage based on the digital data signal (J1) is output includes the first period Tc1 of the first selection state and the second period Tc2 of the second selection state. In the first period Tc1, the voltage changes of the input terminals of the amplifier circuit 20 are accelerated even if the voltage changes are large. More specifically, in the initial first period Tc1, the second sub decoder 32 performs processing for increasing the speed of change in the output voltage of the amplifier circuit 20 toward the voltage corresponding to the digital data signal or a voltage near the voltage. The second sub decoder 32 also makes the speed of change in the output voltage uniform, and in the subsequent second period Tc2, stably drives the amplifier circuit 20 to the voltage corresponding to the digital data signal.

Figure 14:
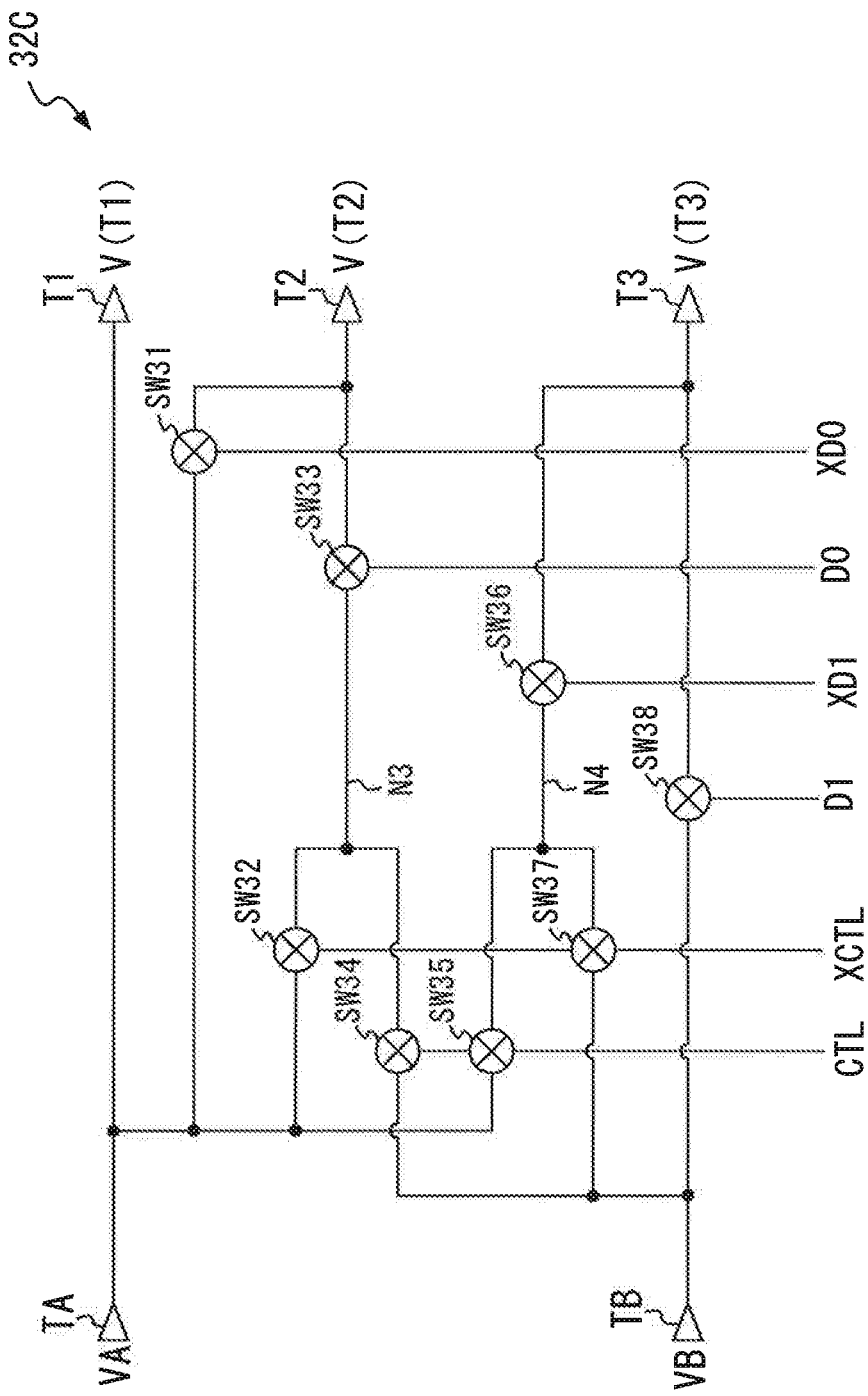
FIG. 14 is a circuit diagram showing an example of an internal configuration of a second sub decoder 32C that is another embodiment of the second sub decoder 32.

FIG. 14 is a circuit diagram showing an example of an internal configuration of a second sub decoder 32c that is the second sub decoder 32 configured on the basis of the specifications of FIGS. 13A and 13B.

The second sub decoder 32C includes terminals TA and TB for receiving respective different selection voltages VA and VB, Nch transistor switches SW31 to SW38, and terminals T1 to T3 serving as output terminals.

The second sub decoder 32C outputs the selection voltage VA received at the terminal TA simply as V(T1) via the terminal T1. The switch SW31 turns on if the inverted bit XD0=1 (high level), and outputs the selection voltage VA received at the terminal TA as V(T2) via the terminal T2. The switch SW 32 turns on if the inverted control signal XCTL=1 (high level), and supplies the selection voltage VA received at the terminal TA to the switch SW33 via a node N3. The switch SW34 turns on if the control signal CTL=1 (high level), and supplies the selection voltage VB received at the terminal TB to the switch SW33 via the node N3.

The switch SW33 turns on if the bit D0=1 (high level), and outputs the selection voltage VA or VB supplied from the switch SW32 or SW34 as V(T2) via the terminal T2.

The switch SW35 turns on if the control signal CTL=1 (high level), and supplies the selection voltage VA received at the terminal TA to the switch SW36 via a node N4.

The switch SW37 turns on if the inverted control signal XCTL=1 (high level), and supplies the selection voltage VB received at the terminal TB to the switch SW36 via the node N4. The switch SW36 turns on if the inverted bit XD1=1 (high level), and outputs the selection voltage VA or VB supplied from the switch SW35 or SW37 as V(T3) via the terminal T3. The switch SW38 turns on if the bit D1=1 (high level), and outputs the selection voltage VB received at the terminal TB as V(T3) via the terminal T3.

The switches SW31 to SW38 may be implemented by Pch (P-channel) transistor switches. More specifically, the conduction type of the transistors is reversed, and the control signals CTL and XCTL and the bits D0, XD0, D1, and XD1 input to the gates of the transistors are interchanged between the original and complementary ones. The circuit configuration of the second sub decoder 32C for implementing the specifications of FIGS. 13A and 13B is not limited to that shown in FIG. 14. For example, the positions of the switches receiving the control signals CTL and XCTL and the bits D0, XD0, D1, and XD1 may be changed.

Figure 15:
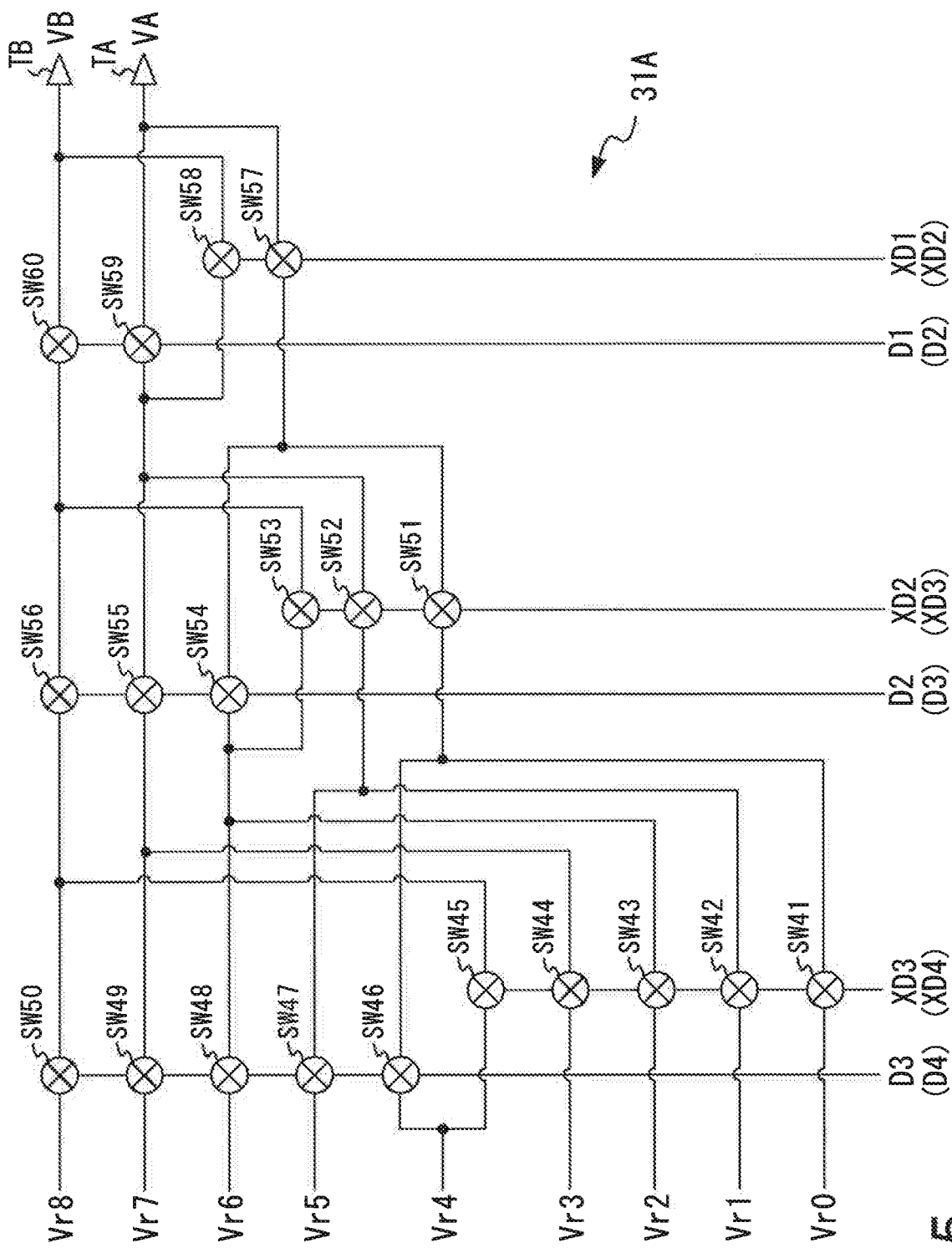
FIG. 15 is a circuit diagram showing a configuration of part of a first sub decoder 31A.

FIG. 15 is a circuit diagram showing part of a first sub decoder 31A that is the first sub decoder 31 included in the decoder 30 shown in FIG. 5, configured according to the specifications shown in FIGS. 9A and 9B.

In the example shown in FIG. 15, the first sub decoder 31A receives nine reference voltages Vr0 to Vr8 as the reference voltage group VX. If the first sub decoder 31A is tailored to the specifications shown in FIG. 9A, the first bit signal group BT1 in the video data signal J1 includes the bits D1 to D3 and XD1 to XD3, for example. If the first sub decoder 31A is tailored to the specifications shown in FIG. 9B, the first bit signal group BT1 in the video data signal J1 includes the bits D2 to D4 and XD2 to XD4, for example.

As shown in FIG. 15, the first sub decoder 31A includes Nch transistor switches SW41 to SW60 and terminals TA and TB serving as output terminals.

The switches SW41 to SW45 turn on if the inverted bit XD3 (XD4)=1 (high level). The switches SW46 to SW50 turn on if the bit D3 (D4)=1 (high level). The switches SW51 to SW53 turn on if the inverted bit XD2 (XD3)=1 (high level). The switches SW54 to SW56 turn on if the bit D2 (D3)=1 (high level). The switches SW57 and SW58 turn on if the inverted bit XD1 (XD2)=1 (high level). The switch SW59 and SW60 turn on if the bit D1 (D2)=1 (high level).

The switch SW41, when turned on, supplies the reference voltage Vr0 to the switch SW51. The switch SW46, when turned on, supplies the reference voltage Vr4 to the switch SW51. The switch SW51, when turned on, supplies the reference voltage Vr0 supplied from the switch SW41 or the reference voltage Vr4 supplied from the switch SW46 to the switch SW57.

The switch SW42, when turned on, supplies the reference voltage Vr1 to the switch SW52. The switch SW47, when turned on, supplies the reference voltage Vr5 to the switch SW52. The switch SW52, when turned on, supplies the reference voltage Vr1 supplied from the switch SW42 or the reference voltage Vr5 supplied from the switch SW47 to the switches SW58 and SW59.

The switch SW43, when turned on, supplies the reference voltage Vr2 to the switches SW53 and SW54. The switch SW48, when turned on, supplies the reference voltage Vr6 to the switches SW53 and SW54. The switch SW53, when turned on, supplies the reference voltage Vr2 supplied from the switch SW43 or the reference voltage Vr6 supplied from the switch SW48 to the switch SW60. The switch SW54, when turned on, supplies the reference voltage Vr2 supplied from the switch SW43 or the reference voltage Vr6 supplied from the switch SW48 to the switch SW57.

The switch SW44, when turned on, supplies the reference voltage Vr3 to the switch SW55. The switch SW49, when turned on, supplies the reference voltage Vr7 to the switch SW55. The switch SW55, when turned on, supplies the reference voltage Vr3 supplied from the switch SW44 or the reference voltage Vr7 supplied from the switch SW49 to the switches SW58 and SW59.

The switch SW45, when turned on, supplies the reference voltage Vr4 to the switch SW56. The switch SW50, when turned on, supplies the reference voltage Vr8 to the switch SW56. The switch SW56, when turned on, supplies the reference voltage Vr4 supplied from the switch SW45 or the reference voltage Vr8 supplied from the switch SW50 to the switch SW60.

The switch SW57, when turned on, outputs the reference voltage Vr0 or Vr4 supplied from the switch SW51 or the reference voltage Vr2 or Vr6 supplied from the switch SW54 as the selection voltage VA via the terminal TA.

The switch SW58, when turned on, outputs the reference voltage Vr1 or Vr5 supplied from the switch SW52 or the reference voltage Vr3 or Vr7 supplied from the switch SW55 as the selection voltage VB via the terminal TB.

The switch SW59, when turned on, outputs the reference voltage Vr1 or Vr5 supplied from the switch SW52 or the reference voltage Vr3 or Vr7 supplied from the switch SW55 as the selection voltage VA via the terminal TA.

The switch SW60, when turned on, outputs the reference voltage Vr2 or Vr6 supplied from the switch SW53 or the reference voltage Vr4 or Vr8 supplied from the switch SW56 as the selection voltage VB via the terminal TB.

Fifth Embodiment

FIG. 16A is a chart showing a modification of the specifications shown in FIG. 9A.

The specifications shown in FIG. 16A are obtained by shifting the relationship between the level determined by the bit codes of the digital data signal and a combination of reference voltages Vref selected as the voltages V(T1) and V(T2) of the input terminals T1 and T2 of the amplifier circuit 20 in the specifications of FIG. 9A by one level. Specifically, the combinations of the selection voltages V(T1) and V(T2) corresponding to levels 1, 2, 3, . . . in FIG. 9A are assigned to levels 0, 1, 2, . . . in FIG. 16A. Such a modification of the specifications can also be carried out.

FIGS. 16B and 16C show examples of the operation modes of the second sub decoder 32 employing the specifications of FIG. 16A in the first and second selection states, respectively.

Suppose that the decoder 30 is set to the first selection state on the basis of the control signal CTL=0 (low level). In such a case, as shown in FIG. 16B, the second sub decoder 32 supplies two selection voltages VA and VB having respective different voltage values to the terminals T1 and T2 of the amplifier circuit 20, respectively, regardless of the value of the bit D0. The amplifier circuit 20 receives the selection voltages VA and VB at the terminals T1 and T2 with weights of 1:1, and outputs a weighted average voltage (VA+VB)/2 on the basis of the weights. The voltages of the terminals T1 and T2 thus change quickly in the first selection state.

Suppose that the decoder 30 is set to the second selection state on the basis of the control signal CTL=1 (high level). As shown in FIG. 16C, if the bit D0=0, the second sub decoder 32 supplies the voltages VA and VB to the terminals T1 and T2 of the amplifier circuit 20, respectively. The amplifier circuit 20 outputs a voltage (VA+VB)/2 obtained by averaging the voltages VA and VB with weights as the output voltage. Suppose that the decoder 30 is set to the second selection state on the basis of the control signal CTL=1 (high level). As shown in FIG. 16C, if the bit D0=1, the second sub decoder 32 supplies only one of the selection voltages VA and VB, namely, the selection voltage VB to both the terminals T1 and T2 of the amplifier circuit 20. Here, the amplifier circuit 20 outputs the voltage VB.

The second sub decoder 32 for implementing the operations shown in FIGS. 16B and 16C can be configured by interchanging the original and complementary signals of the bits D0 and XD0, interchanging the voltages VA and VB, and interchanging V(T1) and V(T2) in the circuit configuration shown in FIG. 11 or 12.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2019-45089 filed on Mar. 12, 2019, the entire contents of which are incorporated herein by reference.

What is claimed is:

1. A digital-to-analog conversion circuit comprising:
a reference voltage generation circuit configured to generate a reference voltage group including a plurality of reference voltages having respective different voltage values;
a decoder configured to receive a digital data signal for a predetermined data period, select two reference voltages from said reference voltage group in a manner allowing redundancy on a basis of said digital data signal, and output the two reference voltages as first and second selection voltages; and
an amplifier circuit configured to output a voltage as an output voltage, the voltage being obtained by averaging a plurality of voltages with weighting factors set in advance and amplifying the average, the plurality of voltages each being either said first selection voltage or said second selection voltage, wherein said decoder is set to a first selection state for a first period within the predetermined data period and is set to a second selection state for a second period after the first period within the predetermined data period, and if set to said first selection state, selects two different reference voltages from said reference voltage group on a basis of said digital data signal and outputs the two reference voltages as said first and second selection voltages, and if set to said second selection state, selects two reference voltages from said reference voltage group in the manner allowing redundancy on a basis of said digital data signal and outputs the two reference voltages as said first and second selection voltages.

2. The digital-to-analog conversion circuit according to claim 1, wherein:
said amplifier circuit includes first to Nth (N is an integer of 2 or more) input terminals, receives N selection voltages each being either said first selection voltage or said second selection voltage at said first to Nth input terminals, and outputs a voltage as the output voltage, the voltage being obtained by averaging the N selection voltages with weighting factors set for said first to Nth input terminals and amplifying the average; and
said decoder, if set to said first selection state, supplies said first selection voltage to m (m is an integer of 1 or more) of said first to Nth input terminals and supplies said second selection voltage to remaining (N−m) of said first to Nth input terminals, and if set to said second selection state, supplies said first selection voltage or said second selection voltage to each of said first to Nth input terminals.

3. The digital-to-analog conversion circuit according to claim 2, wherein:
said digital data signal includes t (t is an integer of 2 or more) bits; and
said decoder includes
a first sub decoder configured to select two different reference voltages from said reference voltage group on a basis of a first bit group in said digital data signal including said t bits, and output the two reference voltages as two selection voltages, and a second sub decoder configured to select either one or both of said two selection voltages output from said first sub decoder as said first and second selection voltages on a basis of a second bit group in said digital data signal, and selectively supply either one of the first and second selection voltages to said first to Nth input terminals of said amplifier circuit.

4. The digital-to-analog conversion circuit according to claim 3, wherein said first bit group is an upper bit group of said t bits, and said second bit group is a lower bit group of said t bits.

5. The digital-to-analog conversion circuit according to claim 2, wherein a ratio between a sum of the weighting factors set for said m input terminals among said first to Nth input terminals of said amplifier circuit and a sum of the weighting factors set for said (N−m) input terminals is 1:1.

6. The digital-to-analog conversion circuit according to claim 2, wherein if said decoder is set to said first selection state, said amplifier circuit outputs a voltage ½ of a sum of said first and second selection voltages output from said decoder as said output voltage.

7. The digital-to-analog conversion circuit according to claim 1, wherein:
said amplifier circuit includes a differential stage circuit including a plurality of differential pairs of a same conduction type, a current mirror circuit connected to output ends of said plurality of differential pairs in common, and an amplifier stage circuit configured to output said output voltage via an output terminal;
said input terminals of said amplifier circuit are constituted by either one of input ends of each of said plurality of differential pairs, and another input end of each of said plurality of differential pairs is connected to said output terminal in a feedback manner; and
said amplifier stage circuit receives at least either one of voltages at a pair of connection nodes between the output ends of said plurality of differential pairs and said current mirror circuit, and generates said output voltage corresponding to said voltage.

8. The digital-to-analog conversion circuit according to claim 1, wherein said reference voltage generation circuit includes a ladder resistor configured to generate said plurality of reference voltages.

9. The digital-to-analog conversion circuit according to claim 1, wherein said decoder, if set to said first selection state, selects one reference voltage based on said digital data signal and a reference voltage having a voltage value one level higher or lower than that of the one reference voltage from said reference voltage group, and outputs the selected reference voltages as said first and second selection voltages, respectively.

10. A digital-to-analog conversion circuit comprising:
a decoder configured to receive a digital data signal for a predetermined data period, and output first and second voltages having respective different voltage values or a same voltage value on a basis of said digital data signal; and
an amplifier circuit configured to output a voltage as an output voltage, the voltage obtained by averaging a plurality of voltages with weighting factors set in advance and amplifying the average, the plurality of voltages each being either one of said first and second voltages, wherein
said decoder is set to a first selection state for a first period within the predetermined data period and is set to a second selection state for a second period after the first period within the predetermined data period, and if set to said first selection state, outputs two voltages having respective different voltage values based on said digital data signal as said first and second voltages, and if set to said second selection state, outputs either one or both of the two voltages having the respective different voltage values based on said digital data signal as said first and second voltages.

11. The digital-to-analog conversion circuit according to claim 10, wherein:
said amplifier circuit includes first to Nth (N is an integer of 2 or more) input terminals, receives N selection voltages each being either said first selection voltage or said second selection voltage at said first to Nth input terminals, and outputs a voltage as the output voltage, the voltage being obtained by averaging the N selection voltages with weighting factors set for said first to Nth input terminals and amplifying the average; and
said decoder, if set to said first selection state, supplies said first selection voltage to m (m is an integer of 1 or more) of said first to Nth input terminals and supplies said second selection voltage to remaining (N−m) of said first to Nth input terminals, and if set to said second selection state, supplies said first selection voltage or said second selection voltage to each of said first to Nth input terminals.

12. A data driver comprising a digital-to-analog conversion unit configured to receive a video data signal expressing a brightness level by digital data for a predetermined data period, convert said video data signal into a driving voltage having a voltage value corresponding in magnitude to said brightness level, and supply the driving voltage to a display device, wherein the digital-to-analog conversion unit includes:
a reference voltage generation circuit configured to generate a reference voltage group including a plurality of reference voltages having respective different voltage values;
a decoder configured to select two reference voltages from said reference voltage group in a manner allowing redundancy on a basis of said video data signal, and output the two reference voltages as first and second selection voltages; and
an amplifier circuit configured to output a voltage as said driving voltage, the voltage being obtained by averaging a plurality of voltages with weighting factors set in advance and amplifying the average, the plurality of voltages each being either said first selection voltage or said second selection voltage, and
said decoder is set to a first selection state for a first period within the predetermined data period and is set to a second selection state for a second period after the first period within the predetermined data period, and if set to said first selection state, selects two different reference voltages from said reference voltage group on a basis of said video data signal and outputs the two reference voltages as said first and second selection voltages, and if set to said second selection state, selects two reference voltages from said reference voltage group in a manner allowing redundancy on a basis of said video data signal and outputs the two reference voltages as said first and second selection voltages.

13. A data driver comprising a digital-to-analog conversion unit configured to receive a video data signal expressing a brightness level by digital data for a predetermined data period, convert said video data signal into a driving voltage having a voltage value corresponding in magnitude to said brightness level, and supply the driving voltage to a display device, wherein the digital-to-analog conversion unit includes:
a decoder configured to output first and second voltages having respective different voltage values or a same voltage value on a basis of said video data signal; and
an amplifier circuit configured to output a voltage as an output voltage, the voltage being obtained by averaging a plurality of voltages with weighting factors set in advance and amplifying the average, the plurality of voltages each being either one of said first and second voltages,
said decoder is set to a first selection state for a first period within the predetermined data period and is set to a second selection state for a second period after the first period within the predetermined data period, and if set to said first selection state, outputs two voltages having respective different voltage values based on said video data signal as said first and second voltages, and if set to said second selection state, outputs either one or both of the two voltages having the respective different voltage values based on said video data signal as said first and second voltages.

14. The data driver according to claim 12, wherein:
said amplifier circuit includes first to Nth (N is an integer of 2 or more) input terminals, receives N selection voltages each being either said first selection voltage or said second selection voltage at said first to Nth input terminals, and outputs a voltage as the output voltage, the voltage being obtained by averaging the N selection voltages with weighting factors set for said first to Nth input terminals and amplifying the average; and
said decoder, if set to said first selection state, supplies said first selection voltage to m (m is an integer of 1 or more) of said first to Nth input terminals and supplies said second selection voltage to remaining (N−m) of said first to Nth input terminals, and if set to said second selection state, supplies said first selection voltage or said second selection voltage to each of said first to Nth input terminals.

* * * * *